(12) United States Patent
Yamashita

(10) Patent No.: US 10,269,854 B2
(45) Date of Patent: Apr. 23, 2019

(54) REROUTING METHOD AND A STRUCTURE FOR STACKED IMAGE SENSORS

(71) Applicant: Taiwan Semiconductor Manufacturing Co., Ltd., Hsin-Chu (TW)

(72) Inventor: Yuichiro Yamashita, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 44 days.

(21) Appl. No.: 15/138,452

(22) Filed: Apr. 26, 2016

(65) Prior Publication Data
US 2017/0309667 A1    Oct. 26, 2017

(51) Int. Cl.
H01L 27/146    (2006.01)
H01L 23/48    (2006.01)
H01L 23/00    (2006.01)

(52) U.S. Cl.
CPC .... H01L 27/14636 (2013.01); H01L 27/1469 (2013.01); H01L 27/14634 (2013.01); H01L 27/14643 (2013.01); H01L 27/14689 (2013.01)

(58) Field of Classification Search
CPC ......... H01L 27/14634; H01L 27/14636; H01L 27/14643; H01L 27/14689; H01L 27/1469
See application file for complete search history.

(56) References Cited

U.S. PATENT DOCUMENTS

| 7,965,329 | B2* | 6/2011 | McCarten | H01L 27/14641 348/308 |
| 9,165,974 | B2* | 10/2015 | Kim | H01L 27/14609 |
| 2005/0023033 | A1* | 2/2005 | Saiki | H01L 23/49827 174/260 |
| 2014/0263959 | A1* | 9/2014 | Hsu | H01L 31/18 250/208.1 |

(Continued)

OTHER PUBLICATIONS

Shang-Fu Yeh, et al.; "A New CMOS Image Sensor Readout Structure for 3D Integrated Imagers;" 2011 IEEE, p. 1-4.

(Continued)

*Primary Examiner* — Mark W Tornow
*Assistant Examiner* — Priya M Rampersaud
(74) *Attorney, Agent, or Firm* — Eschweiler & Potashnik, LLC

(57) ABSTRACT

A stacked image sensor with a rerouting layer is provided for a high readout rate and a high functionality per footprint area. A pixel chip is arranged over a logic chip. The pixel chip and the logic chip respectively comprise a pixel sensor array and a readout circuit array. A first conductive feature array is arranged under and electrically coupled to the pixel sensor array. The first conductive feature array has a first pitch. A second conductive feature array is arranged over and electrically coupled to the readout circuit array. The second conductive feature array has a second pitch different than the first pitch. The rerouting layer is arranged between the first and second conductive feature arrays. The rerouting layer electrically couples the first conductive feature array to the second conductive feature array while translating between the first and second pitches. A method for manufacturing the stacked image sensor is also provided.

20 Claims, 11 Drawing Sheets

(56) References Cited

U.S. PATENT DOCUMENTS

| | | | |
|---|---|---|---|
| 2015/0115131 A1* | 4/2015 | Webster | H01L 27/14603 |
| | | | 250/208.1 |
| 2015/0288908 A1* | 10/2015 | Shen | G06F 17/5072 |
| | | | 348/308 |
| 2016/0190198 A1* | 6/2016 | Kwon | H01L 27/14636 |
| | | | 257/435 |
| 2017/0180663 A1* | 6/2017 | Mabuchi | H04N 5/378 |
| 2017/0186798 A1* | 6/2017 | Yang | H01L 27/14634 |

OTHER PUBLICATIONS

"A ¼-inch 8Mpixel Back-Illuminated Stacked CMOS Image Sensor," 2013 IEEE International Solid-State Circuits Conference; ISSCC 2013 / Session 27 / Image Sensors / 27.4; p. 484-486.

* cited by examiner

REROUTING METHOD AND A STRUCTURE FOR STACKED IMAGE SENSORS

BACKGROUND

Many modern day electronic devices comprise image sensors. Some types of image sensors include charge-coupled device (CCD) image sensors and complementary metal-oxide-semiconductor (CMOS) image sensors. Compared to CCD image sensors, CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
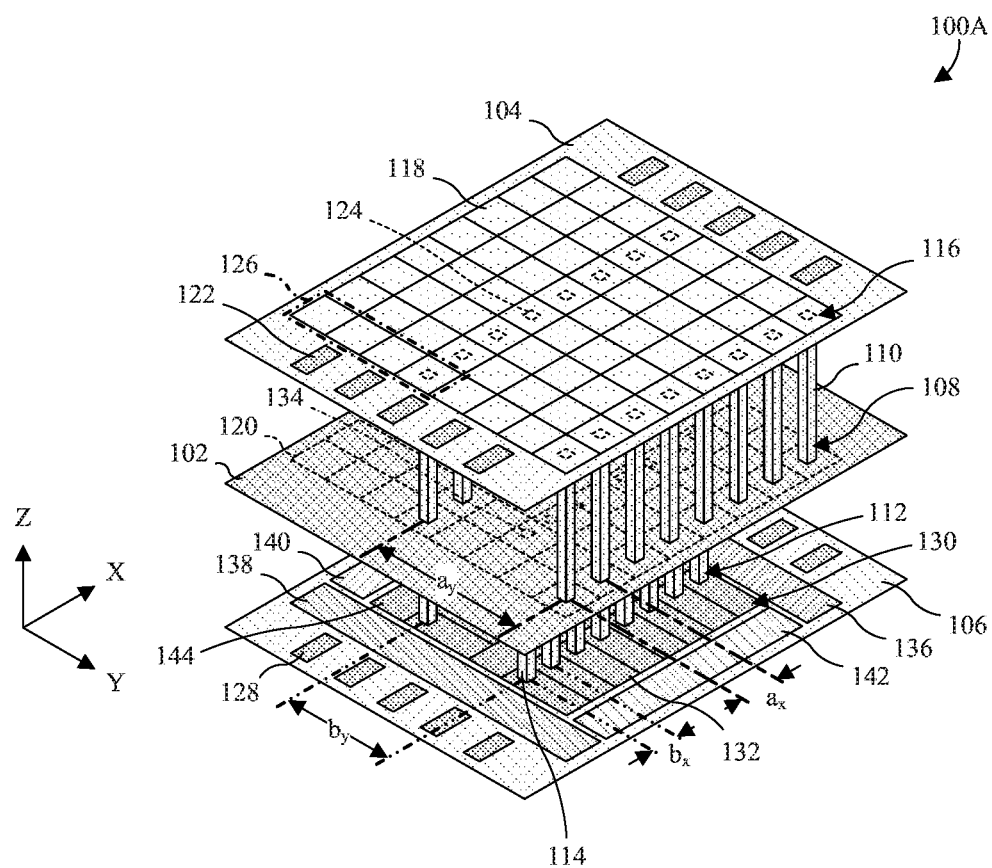
FIG. 1A illustrates a perspective view of some embodiments of a stacked image sensor with a rerouting layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors comprise an array of pixel sensors and logic circuits arranged within a common integrated circuit (IC) chip. However, such image sensors have large footprints (i.e., two dimensional (2D) projections onto a horizontal plane) and low functionality per footprint area. Therefore, some other image sensors employ stacking to reduce footprints and increase functionality per footprint area. Stacked image sensors comprise an array of pixel sensors and logic circuits respectively arranged in a pixel chip and a logic chip, where the pixel chip is arranged over and electrically coupled to the logic chip.

According to one type of stacked image sensor, the logic circuits comprises a single readout circuit for each column of the pixel sensor array, and the readout circuits are electrically coupled to the columns at a periphery of the pixel sensor array. Such an arrangement has a small footprint and high functionality per footprint area. However, a readout rate (i.e., frame rate) of the pixel sensor array is low since the number of pixel sensors that can be read out in parallel (i.e., one for each column) is low.

According to another type of stacked image sensor, the pixel sensor array is divided into blocks of adjoining pixel sensors, such as, for example, 4×4 blocks of adjoining pixel sensors. Further, the logic circuits are configured with readout circuits electrically coupled to and arranged directly under corresponding ones of the blocks. Such an arrangement may have a high readout rate of the pixel sensor array since readout parallelism may be increased. For example, multiple pixel sensors of a column may be readout in parallel. However, the arrangement is also dependent upon the readout circuits being directly under the corresponding blocks. Since the blocks have larger footprints than the readout circuits, spacing between the readout circuits is increased to match a pitch of the blocks, thereby decreasing functionality per footprint area. Further, a footprint of the stacked image sensor may increase or chip area for other components of the logic circuits, such as an image signal process (ISP), may decrease to accommodate the increased chip area of the readout circuit array.

The present application is directed to a stacked image sensor with a rerouting layer for a high readout rate and a high functionality per footprint area. In some embodiments, a pixel chip comprises an array of pixel sensors, and a logic chip underlying the pixel chip comprises an array of readout circuits. An array of first conductive structures with a first pitch is arranged under and electrically coupled to the pixel sensor array. An array of second conductive structures with a second pitch different than the first pitch is arranged over and electrically coupled to the readout circuit array. A rerouting layer is arranged between the first and second conductive structure arrays, and electrically couples the first conductive structure array to the second conductive structure array while translating between the first and second pitches. In some embodiments, the first and second conductive structure arrays are arrays of vias.

By translating between the first and second pitches, the rerouting layer advantageously allows the stacked image sensor to achieve a high readout rate while also achieving a high functionality per footprint area. For example, the pixel sensor array may be divided into blocks of adjoining pixel sensors, such as 4×1 blocks of adjoining pixel sensors, and the readout circuits may be arranged under and electrically coupled to corresponding ones of the blocks through the rerouting layer. Multiple readout circuits per column, or more generally a dense distribution of readout circuits, result in high readout parallelism and allow the stacked image sensor to achieve a high readout rate. Further, the rerouting layer allows the readout circuits to electrically couple to the blocks without matching a pitch of the blocks, thereby allowing a high functionality per footprint area (e.g., the rerouting layer may provide signal routing from blocks arranged at a first pitch to readout circuits arranged at a smaller, second pitch, thereby allowing the readout circuits to have smaller footprints than the blocks).

With reference to FIG. 1A, a perspective view 100A of some embodiments of a stacked image sensor with a rerouting layer 102 is provided. The rerouting layer 102 is arranged between a pixel chip 104 and a logic chip 106, on a lower side of the pixel chip 104 and an upper side of the logic chip 106, and is defined by one or more interconnect layers of interconnect features (not shown). An upper side of the rerouting layer 102 electrically couples with a first via array 108 of first vias 110, and a lower side of the rerouting layer 102 electrically couples with a second via array 112 of second vias 114. The rerouting layer 102 electrically couples the first vias 110 to corresponding ones of the second vias 114 and laterally translates between different pitches of the first and second via arrays 108, 112. The correspondence between the first vias 110 and the second vias 114 may be, for example, one to one.

The first via array 108 has an x-direction pitch $a_x$ and a y-direction pitch $a_y$, and the second via array 112 has an x-direction pitch $b_x$ and a y-direction pitch $b_y$. In some embodiments, the x-direction pitch $a_x$, $b_x$ of the first or second via array 108, 112 is intra-row spacing between neighboring vias, and/or the y-direction pitch $a_y$, $b_y$ of the first or second via array 108, 112 is intra-column spacing between neighboring vias. The spacing may be measured, for example, between sidewalls, edges, or footprint centroids of the neighboring vias. Further, in some embodiments, the x-direction pitch $a_x$ of the first via array 108 is greater than the x-direction pitch $b_x$ of the second via array 112, and/or the y-direction pitch $a_y$ of the first via array 108 is greater than the y-direction pitch $b_y$ of the second via array 112. The rerouting layer 102 extends laterally in the x direction to translate between the x-direction pitch $a_x$ of the first via array 108 and the x-direction pitch $b_x$ of the second via array 112, and extends laterally in the y direction to translate between the y-direction pitch $a_y$ of the first via array 108 and the y-direction pitch $b_y$ of the second via array 112.

The pixel chip 104 is arranged on the upper side the rerouting layer 102, and comprises a pixel sensor array 116 of pixel sensors 118. For clarity, projections 120 of the pixel sensors 118 are shown in phantom on the rerouting layer 102. In some embodiments, the pixel chip 104 further comprises first pads 122 arranged along an edge of the pixel sensor array 116. The pixel sensor array 116 is electrically coupled to the rerouting layer 102 through the first via array 108 and, in some embodiments, directly overlies the first via array 108. For clarity, projections 124 of the first vias 110 are shown in phantom on the pixel sensors 118. The pixel sensors 118 are configured to measure incident radiation and may be, for example, active pixel sensors (APSs) or photo-detectors. Further, the pixel sensors 118 are arranged in rows and columns that respectively extend laterally in the x direction and the y direction, and are grouped into blocks 126 of adjoining pixel sensors.

The blocks 126 of adjoining pixel sensors are electrically coupled to corresponding ones of the first vias 110. In some embodiments, the correspondence between the blocks 126 and the first vias 110 is one to one, and/or the blocks 126 are arranged directly over the corresponding ones of the first vias 110. Further, in some embodiments, the blocks 126 are electrically coupled to the corresponding ones of the first vias 110 by an interconnect structure (not shown) of the pixel chip 104, and/or have same x-direction and/or y-direction pitches as the first via array 108. Even more, in some embodiments, the blocks 126 share a size of M×N, where M is the number of rows a block spans and N is the number of columns the block spans. For example, the blocks 126 may each have a size of 4×1.

The logic chip 106 is arranged on the lower side of the rerouting layer 102, and comprises logic circuits configured to support operation of the pixel sensors 118. In some embodiments, the logic chip 106 comprises second pads 128 arranged along an edge of logic chip 106. The logic circuits comprise a readout circuit array 130 of readout circuits 132 electrically coupled to the rerouting layer 102 through the second via array 112. Further, in some embodiments, the readout circuit array 130 directly underlies the second via array 112. The readout circuits 132 are configured to readout measurements of the pixel sensors 118 and are electrically coupled to the rerouting layer 102 through corresponding ones of the second vias 114. In some embodiments, the correspondence between the readout circuits 132 and the second vias 114 is one to one, and/or the readout circuits 132 directly underlie the corresponding ones of the second vias 114. For clarity, projections 134 of the second vias 114 are shown in phantom on the rerouting layer 102. The readout circuits 132 may be, for example, electrically coupled to the corresponding ones of the second vias 114 by an interconnect structure of the logic chip (not shown), and/or may be, for example, column analog-to-digital (ADC) converters. Further, the readout circuits 132 may have, for example, same x-direction and/or y-direction pitches as the second via array 112.

In some embodiments, the logic circuits comprise first peripheral circuits 136, second peripheral circuits 138, third peripheral circuits 140, and fourth peripheral circuits 142 laterally surrounding the readout circuit array 130 on respective sides of the readout circuit array 130. The first peripheral circuits 136 may be or otherwise comprise, for example, an ISP. The second peripheral circuits 138 may be or otherwise comprise, for example, a row decoder/driver. The third peripheral circuits 140 may be or otherwise comprise, for example, analog circuits. The fourth peripheral circuits 142 may be or otherwise comprise, for example, digital circuits. Further, in some embodiments, the logic circuits comprise signal line blocks 144 adjoining corresponding rows of the readout circuits 132 and/or laterally spacing neighboring rows of the readout circuits 132 from one another. The correspondence between the signal line blocks 144 and the rows may be, for example, one to one, and/or the signal line blocks 144 may, for example, each comprise a signal readout bus and/or shift registers.

Figure 1B:
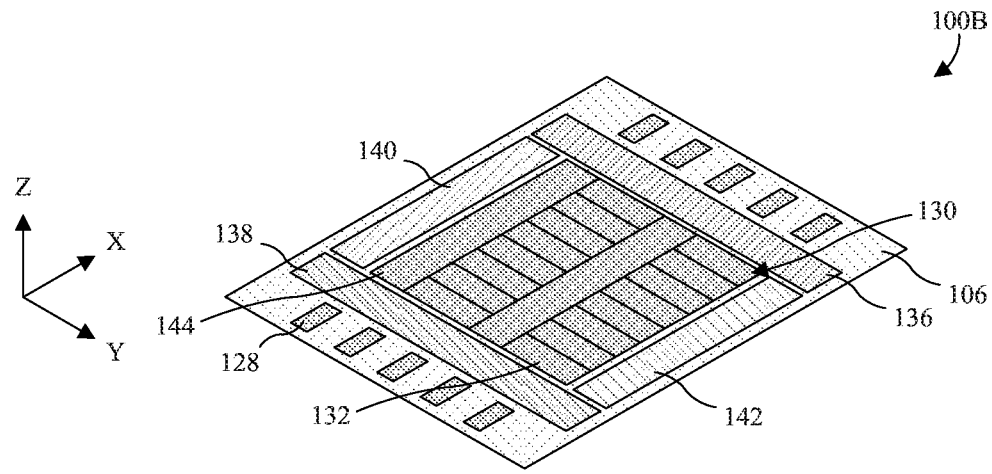
FIG. 1B illustrates a perspective view of some embodiments of a logic chip in FIG. 1A.

With reference to FIG. 1B, a perspective view 100B of some embodiments of the logic chip 106 is provided. As illustrated, the first peripheral circuits 136 and the second peripheral circuits 138 may, for example, be laterally spaced in the x direction and/or arranged on opposite sides of the readout circuit array 130. Further, the first peripheral circuits 136 and the second peripheral circuits 138 may, for example, extend laterally in the y direction from one end of the logic chip 106 to an opposite end of the logic chip 106. Also illustrated by FIG. 1B, the third peripheral circuits 140 and the fourth peripheral circuits 142 may, for example, be laterally spaced in the y direction and/or arranged on opposite sides of the readout circuit array 130. Further, the third peripheral circuits 140, the fourth peripheral circuits 142, and the signal line blocks 144 may, for example, extend laterally in the x direction from proximate the first peripheral circuits 136 to proximate the second peripheral circuits 138.

Advantageously, the rerouting layer 102 electrically couples the readout circuits 132 to respective ones of the blocks 126 through the first and second vias 110, 114 to allow the stacked image sensor to achieve a high readout rate while also achieving a high functionality per footprint area. Multiple readout circuits 132 per column result in high readout parallelism and allow the stacked image sensor to achieve the high readout rate. Further, translating between the x-direction and y-direction pitches $a_x$, $a_y$, $b_x$, $b_y$ of the first and second via arrays 108, 112 allows the readout circuits 132 to electrically couple to the blocks 126 without matching a pitch of the blocks 126, thereby allowing a high functionality per footprint area.

While the pixel sensor array 116 was illustrated with 8 rows and 8 columns of pixel sensors 118, more or less rows and/or columns may be employed. Further, while the readout circuit array 130 was illustrated with 2 rows and 8 columns, more or less rows and/or columns may be employed. Moreover, while the blocks 126 of the pixel sensor array 116 were illustrated as individually spanning 4 rows and 1 column, the blocks 126 may individually span more or less columns and/or more or less rows. Even more, while the rerouting layer 102 was illustrated and described as connecting the first via array 108 to the second via array 112 while translating between pitches of the first and second via arrays 108, 112, the rerouting layer 102 may more generally be employed to connect a first conductive structure array to a second conductive structure array while translating between pitches of the first and second conductive structure arrays. As such, the first and second via arrays 108, 112 are examples of the first and second conductive structure arrays. Other examples of the first and second conductive structure arrays are arrays of conductive pads, electrodes, or other conductive structures.

Figure 2:
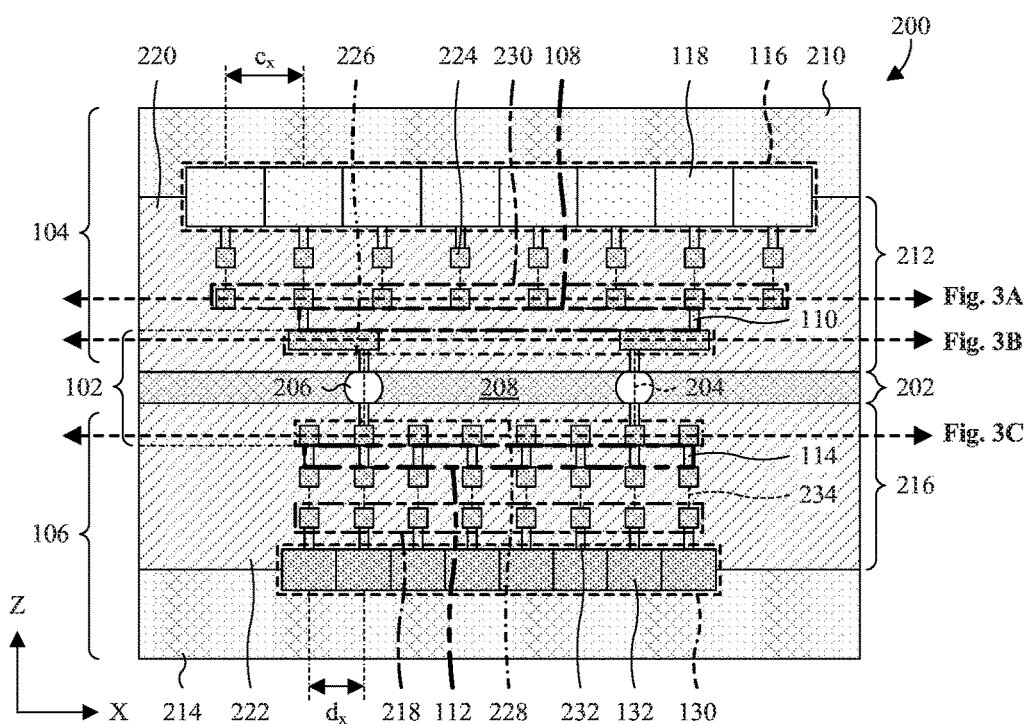
FIG. 2 illustrates a cross-sectional view of some embodiments of the stacked image sensor of FIG. 1A in which the rerouting layer is shared between a pixel chip and a logic chip.

With reference to FIG. 2, a cross-sectional view 200 of some embodiments of the stacked image sensor of FIG. 1A is provided. As illustrated, a chip-to-chip (C2C) interface layer 202 is arranged under a pixel chip 104 and over a logic chip 106, and is configured to bond the pixel chip 104 to the logic chip 106. Further, the C2C interface layer 202 is configured to electrically couple the pixel chip 104 to the logic chip 106 along first conductive paths 204 (shown in phantom) extending from the pixel chip 104 to the logic chip 106. In some embodiments, the C2C interface layer 202 comprises solder bumps 206 and a dielectric filler layer 208. The solder bumps 206 partially define the first conductive paths 204 and are a conductive material, such as, for example, copper or some other metal. The dielectric filler layer 208 electrically insulates the solder bumps 206 and fills space between the pixel and logic chips 104, 106. Further, the dielectric filler layer 208 is a dielectric material, such as, for example, an oxide, and may be, for example, an organic material.

The pixel chip 104 is arranged over and bonded to the logic chip 106 through the C2C interface layer 202. The pixel chip 104 and the logic chip 106 respectively comprise a pixel sensor array 116 and a readout circuit array 130. The pixel sensor array 116 is arranged on a lower side of a first semiconductor substrate 210, between the first semiconductor substrate 210 and a first interconnect structure 212 that underlies the first semiconductor substrate 210. The readout circuit array 130 is arranged on an upper side of a second semiconductor substrate 214, between the second semiconductor substrate 214 and a second interconnect structure 216 that overlies the second semiconductor substrate 214. The first and second semiconductor substrates 210, 214 may be, for example, bulk substrates of silicon or some other semiconductor material.

The pixel sensor array 116 comprises pixel sensors 118 laterally arranged in rows and/or columns with an x-direction pitch $c_x$, and the readout circuit array 130 comprises readout circuits 132 laterally arranged in rows and columns with an x-direction pitch $d_x$. In some embodiments, the x-direction pitch $c_x$ of the pixel sensor array 116 is greater than the x-direction pitch $d_x$ of the readout circuit array 130. Pitch is a distance between neighboring elements of an array, such as the pixel sensors 118, and may be, for example, inversely proportional to a density of the array. In some embodiments, the distance is an intra-row or intra-column distance in the array. The pixel sensors 118 are configured to measure incident radiation (e.g., light), and the readout circuits 132 are configured to readout the measurements of the pixel sensors 118. Further, the pixel sensors 118 are electrically coupled to corresponding ones of the readout circuits 132 through the first and second interconnect structures 212, 216 and the C2C interface layer 202. In some embodiments, the correspondence between the pixel sensors 118 and the readout circuits 132 is many to one. The pixel sensors 118 may be, for example, APSs, and/or the readout circuits 132 may be, for example, ADC converters.

The first interconnect structure 212 is arranged on the lower side of the first semiconductor substrate 210, between the first semiconductor substrate 210 and the C2C interface layer 202. Further, the second interconnect structure 216 is arranged on the upper side of the second semiconductor substrate 214, between the second semiconductor substrate 214 and the C2C interface layer 202. The first and second interconnect structures 212, 216 comprise respective interconnect layers 218 vertically stacked within respective first and second interlayer (ILD) regions 220, 222. The first and second ILD regions 220, 222 may be, for example, silicon dioxide, a low κ dielectric (i.e., a dielectric with a dielectric constant κ less than about 3.9), phosphosilicate glass (PSG), or some other dielectric.

The interconnect layers 218 are defined by respective interconnect features 224, such as conductive lines, and comprise a first interconnect layer 226, a second interconnect layer 228, and a third interconnect layer 230. The first and second interconnect layers 226, 228 are arranged adjacent to the C2C interface layer 202, respectively over and under the C2C interface layer 202. In some embodiments, the first and second interconnect layers 226, 228 are closest ones of the interconnect layers 218 to the C2C interface layer 202. The third interconnect layer 230 overlies the first interconnect layer 226 and, in some embodiments, is immediately above the first interconnect layer 226 without an intervening interconnect layer. The interconnect layers 218 are electrically coupled to one another, and to the pixel sensor array 116 and the readout circuit array 130, by intervening vias 232. For ease of illustration, second conductive paths 234 (shown in phantom) between neighboring interconnect layers are employed to represent one or more additional interconnect layers and/or one or more additional vias. The interconnect layers 218, the interconnect features 224, and the vias 232 may be, for example, a metal, such as copper, aluminum copper, aluminum, or tungsten.

The vias 232 comprises first vias 110 defining a first via array 108, and further comprise second vias 114 defining a second via array 112. The first vias 110 correspond to the pixel sensors 118 and the second vias 114, and the second vias 114 correspond to the readout circuits 132. In some embodiments, the correspondence between the first vias 110 and the pixel sensors 118 is one to many, and/or the correspondence between the first vias 110 and the second vias 114 is one to one. Further, in some embodiments, the correspondence between the second vias 114 and the readout circuits 132 is one to one. The first via array 108 is arranged adjacent to and over the first interconnect layer 226, and the second via array 112 is arranged adjacent to and under the second interconnect layer 228. In some embodiments, the first and second via arrays 108, 112 respectively contact the first and second interconnect layers 226, 228. Further, the first and second via arrays 108, 112 have different lateral pitches and, in some embodiments, pitches of the second via array 112 match those of the readout circuit array 130.

A rerouting layer 102 is arranged in both the logic and pixel chips 104, 106, under the first via array 108 and over the second via array 112. Further, the rerouting layer 102 is configured to electrically couple the pixel sensors 118 to respective ones of the readout circuits 132, and comprises the first and second interconnect layers 226, 228. The first and second interconnect layers 226, 228 coordinate to electrically couple the first vias 110 to respective ones of the second vias 114 through the C2C interface layer 202, while also laterally translating between differences in the lateral pitches of the first and second via arrays 108, 112. In some embodiments, the first interconnect layer 226 laterally translates between differences in x-direction pitch, and/or the second interconnect layer 228 laterally translates between differences in y-direction pitch. As described above, by laterally translating between pitches, the rerouting layer 102 allows a high readout rate and a high functionality per footprint area.

Figure 3A:
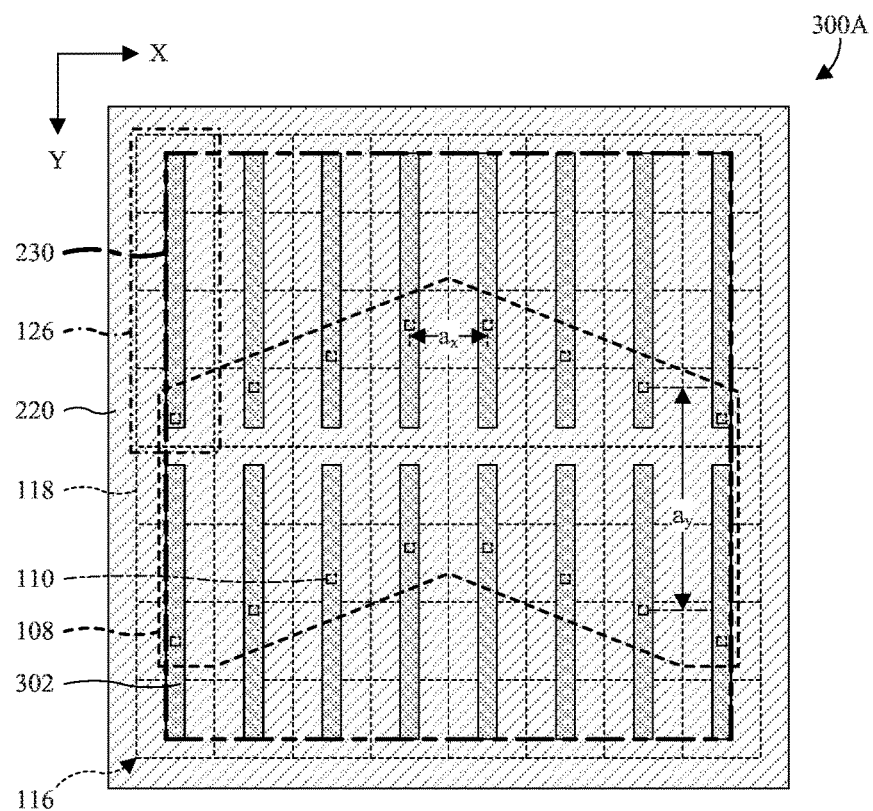
FIGS. 3A-3C illustrate top views of some embodiments of interconnect layers that define or are otherwise associated with the rerouting layer of FIG. 1A.
Figure 3B:
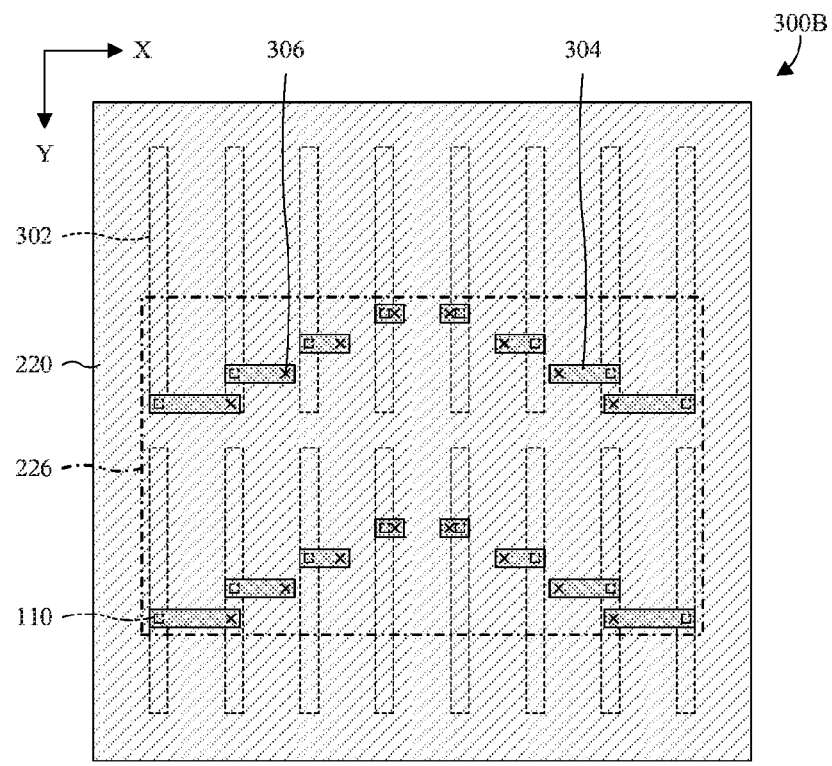
Figure 3C:
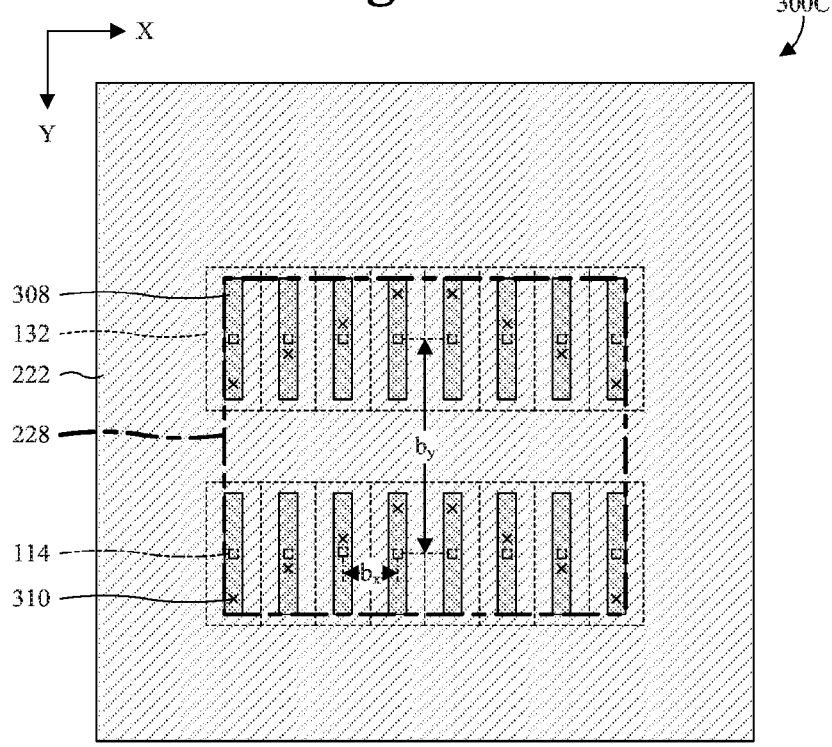

With reference to FIGS. 3A-3C, top views 300A-300C of some embodiments of first, second, and third interconnect layers 226, 228, 230 of FIG. 2 are provided.

As illustrated by the top view of FIG. 3A, a third interconnect layer 230 comprises third interconnect features 302 arranged within a first ILD region 220. The third interconnect features 302 extend laterally in a y direction and, in some embodiments, are line shaped. The third interconnect features 302 underlie corresponding blocks 126 of a pixel sensor array 116, and overlie corresponding first vias 110 of a first via array 108. For clarity, the first via and pixel sensor arrays 108, 116 are shown in phantom. In some embodiments, the correspondence between the third interconnect features 302 and the blocks 126 is one to one, and/or the correspondence between the third interconnect feature 302 and the first vias 110 is one to one.

The blocks 126 overlie corresponding ones of the third interconnect features 302 and are electrically coupled to the corresponding ones of the third interconnect features 302. Further, in some embodiments, the blocks 126 directly overlie the corresponding ones of the third interconnect features 302. The blocks 126 are subarrays of the pixel sensor array 116 and, in some embodiments, are restricted to a single column of the pixel sensor array. For example, the blocks 126 may each comprise four adjoining pixel sensors 118 of respective columns in the pixel sensor array 116. Further, in some embodiments, x-direction and/or y-direction pitches of the blocks 126 match those of the first vias 110.

The first vias 110 underlie corresponding ones of the third interconnect features 302 and are electrically coupled to the corresponding ones of the third interconnect features 302. In some embodiments, the first vias 110 directly underlie the corresponding ones of the third interconnect features 302 and/or directly contact the corresponding ones of the third interconnect features 302. The first vias 110 are laterally spaced uniformly in the y-direction by a y-direction pitch $a_y$, and are laterally spaced uniformly in the x-direction by an x-direction pitch $a_x$. In other words, first vias neighboring in the x direction are spaced by the x-direction pitch $a_x$, and first vias neighboring in the y direction are spaced by the y-direction pitch $a_y$. Further, in some embodiments, the x-direction and y-direction pitches $a_x$, $a_y$ respectively correspond to intra-row spacing and intra-column spacing.

As illustrated by the top view of FIG. 3B, a first interconnect layer 226 comprises first interconnect features 304 arranged within a first ILD region 220. The first interconnect features 304 underlie corresponding third interconnect features 302 and corresponding first vias 110, and are electrically coupled to the third interconnect features 302 through the first vias 110. For clarity, the third interconnect features 302 and the first vias 110 are shown in phantom. In some embodiments, the correspondence between the first interconnect features 304 and the third interconnect features 302 is one to one, and/or the correspondence between the first interconnect features 304 and the first vias 110 is one to one. The first interconnect features 304 extend laterally from the corresponding ones of the third interconnect features 302 to corresponding first electrical coupling points 306 with a C2C interface layer (not shown) and, in some embodiments, are line shaped. The correspondence between the first interconnect features 304 and the first electrical coupling points 306 may be, for example, one to one.

As illustrated by the top view of FIG. 3C, a second interconnect layer 228 comprises second interconnect features 308 arranged within a second ILD region 222. The second interconnect features 308 extend laterally in a y direction and, in some embodiments, are line shaped. Further, the second interconnect features 308 extend laterally to corresponding second electrical coupling points 310. The second electrical coupling points 310 are electrically coupled with a C2C interface layer (not shown) and with corresponding ones of the first electrical coupling points 306 in FIG. 3B. In some embodiments, the second electrical coupling points 310 directly underlie the corresponding ones of the first electrical coupling points 306. The correspondence between the first electrical coupling points 306 and the second electrical coupling points 310 may be, for example, one to one.

Readout circuits 132 corresponding to the second interconnect features 308 underlie the second interconnect features 308 and are electrically coupled to the corresponding ones of the second interconnect features 308 through second vias 114. For clarity, the readout circuits 132 and the second vias 114 are shown in phantom. In some embodiments, the readout circuits 132 directly underlie the corresponding ones of the second interconnect features 308, and/or correspond to the second interconnect features 308 with a one to one correspondence. Further, in some embodiments, x-direction and/or y-direction pitches of the readout circuits 132 match those of the second vias 114.

The second vias 114 underlie the second interconnect features 308 and are electrically coupled to corresponding ones of the second interconnect features 308. In some embodiments, the second vias 114 correspond to the second interconnect features 308 with a one to one correspondence. Further, in some embodiments, the second vias 114 directly underlie and/or directly contact the corresponding ones of the second interconnect features 308. The second vias 114 are laterally spaced uniformly in a y-direction by a y-direction pitch $b_y$, and are laterally spaced uniformly in the x-direction by an x-direction pitch $b_x$. In some embodiments the y-direction pitch $b_y$ of the second vias 114 is less than the y-direction pitch $a_y$ of the first vias 110 in FIGS. 3A and 3B, and/or the x-direction pitch $b_x$ of the second vias 114 is less than the x-direction pitch $a_x$ of the first vias 110 in FIGS. 3A and 3B. Further, in some embodiments, the x-direction and y-direction pitches $b_x$, $b_y$ of the second vias 114 respectively correspond to intra-row spacing and intra-column spacing.

Figure 4:
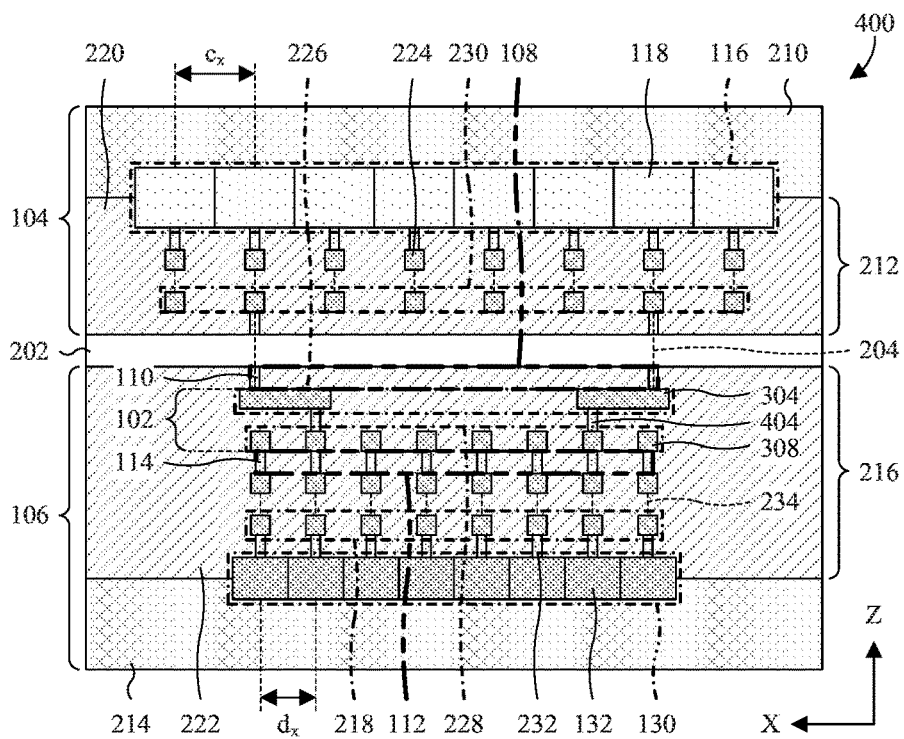
FIG. 4 illustrates a cross-sectional view of some embodiments of the stacked image sensor of FIG. 1A in which the rerouting layer is localized to a logic chip.

With reference to FIG. 4, a cross-sectional view 400 of other embodiments of the stacked image sensor of FIG. 2 is provided in which a rerouting layer 102 is arranged entirely within or localized to a logic chip 106. As illustrated, the rerouting layer 102 comprises a first interconnect layer 226 and a second interconnect layer 228 that are both arranged within a second ILD region 222 of the logic chip 106. The first interconnect layer 226 comprises first interconnect features 304 electrically coupled to a pixel chip 104 arranged thereover through corresponding first conductive paths 204 at least partially defined by a C2C interface layer 202 and/or a first via array 108. In some embodiments, the first conductive paths 204 correspond to the first interconnect features 304 with a one to one correspondence. The second interconnect layer 228 comprises second interconnect features 308 electrically coupled to corresponding ones of the first interconnect features 304 by corresponding additional vias 404 arranged therebetween. In some embodiments, the correspondence between the second interconnect features 308 and the additional vias 404 is one to one, and/or the correspondence between the second interconnect features 308 and the first interconnect features 304 is one to one.

By localizing the rerouting layer 102 to the logic chip 106, lateral pitch of the first conductive paths 204 may advantageously be large for high manufacturability, such as high yield. Further, unused regions of the interconnect layers 218 that overly readout circuits 132 of the logic chip 106 may advantageously be used for the rerouting layer 102, thereby reducing manufacturing costs.

Figure 5:
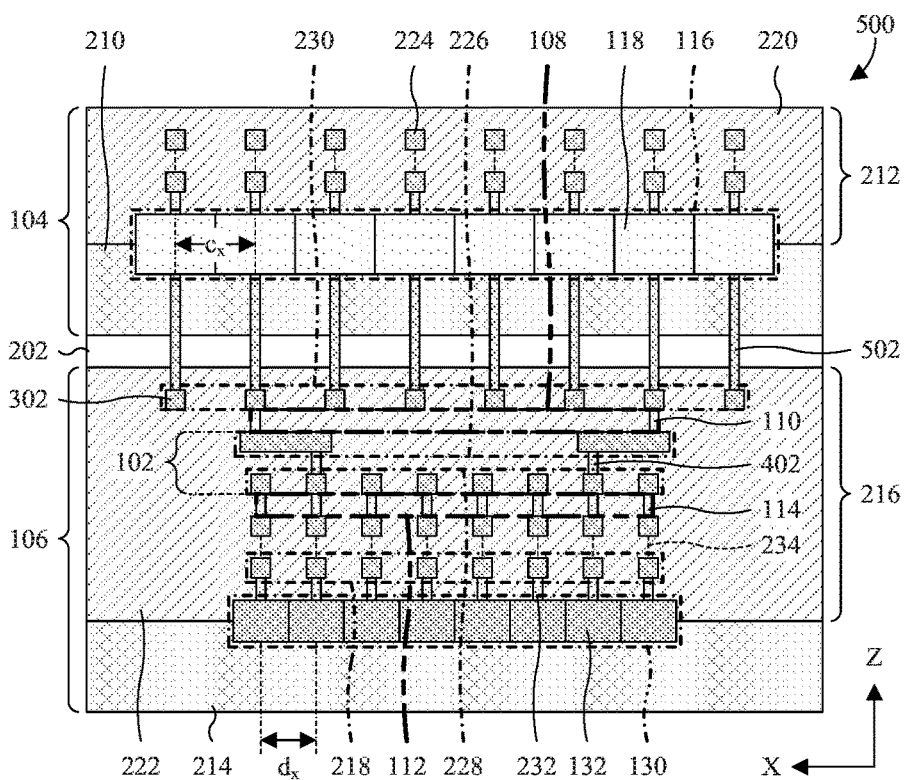
FIG. 5 illustrates a cross-sectional view of some embodiments of the stacked image sensor of FIG. 4 in which an interconnect structure of a pixel chip is arranged on an upper side of the pixel chip.

With reference to FIG. 5, a cross-sectional view 500 of other embodiments of the stacked image sensor of FIG. 4 is provided in which a first interconnect structure 212 of a pixel chip 104 is arranged over a first semiconductor substrate 210 of the pixel chip 104. Further, pixel sensors 118 of the pixel chip 104 are arranged on an upper side of the first semiconductor substrate 210, and covered by the first interconnect structure 212.

A C2C interface layer 202 underlies the pixel chip 104, and bonds the pixel chip 104 to an underlying logic chip 106. The logic chip 106 comprises a second interconnect structure 216 accommodating a third interconnect layer 230. The third interconnect layer 230 is electrically coupled to the pixel sensors 118 by through substrate vias (TSVs) 502, and comprises third interconnect features 302. The third interconnect features 302 are electrically coupled to corresponding ones of the pixel sensors 118 by corresponding ones of the TSVs 502 extending from the pixel sensors 118 to the third interconnect features 302. In some embodiments, the correspondence between the third interconnect features 302 and the pixel sensors 118 is one to one, and/or the correspondence between the third interconnect features 302 and the TSVs 502 is one to one. Further, in some embodiments, the third interconnect features 302 directly underlie the corresponding ones of the pixel sensors 118. The TSVs 502 may be, for example, a metal, such as copper or tungsten, or some other conductive material.

Figure 6:
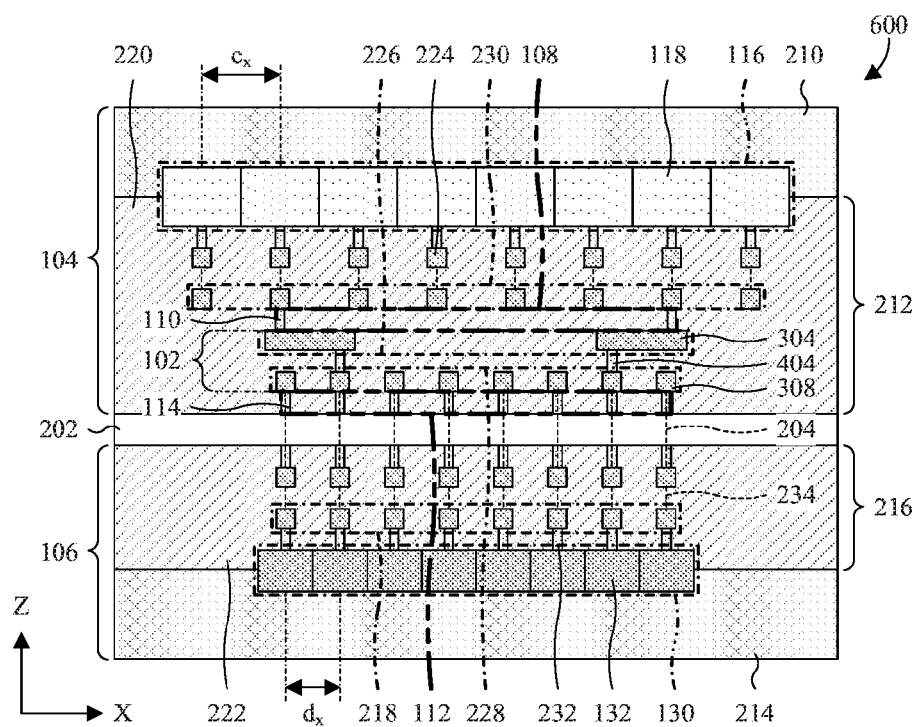
FIG. 6 illustrates a cross-sectional view of some embodiments of the stacked image sensor of FIG. 1A in which the rerouting layer is localized to a pixel chip.

With reference to FIG. 6, a cross-sectional view 600 of other embodiments of the stacked image sensor of FIG. 2 is provided in which a rerouting layer 102 is arranged entirely within or localized to a pixel chip 104. As illustrated, the rerouting layer 102 comprises a first interconnect layer 226 and a second interconnect layer 228 that are both arranged within a first ILD region 220 of the pixel chip 104. The first interconnect layer 226 comprises first interconnect features 304 electrically coupled to a third interconnect layer 230 arranged thereover through corresponding first vias 110. The second interconnect layer 228 comprises second interconnect features 308 electrically coupled to corresponding ones of the first interconnect features 304 by corresponding additional vias 404. Further, the second interconnect features 308 are electrically coupled to corresponding readout circuits 132 arranged thereunder through corresponding first conductive paths 204 at least partially defined by a C2C interface layer 202 and/or a second via array 112. In some embodiments, the first conductive paths 204 correspond to the second interconnect features 308 with a one to one correspondence. Advantageously, by moving the rerouting layer 102 entirely to the pixel chip 104, design margins and rules may be relaxed in some embodiments. As such, total chip cost may be minimized.

Figure 7:
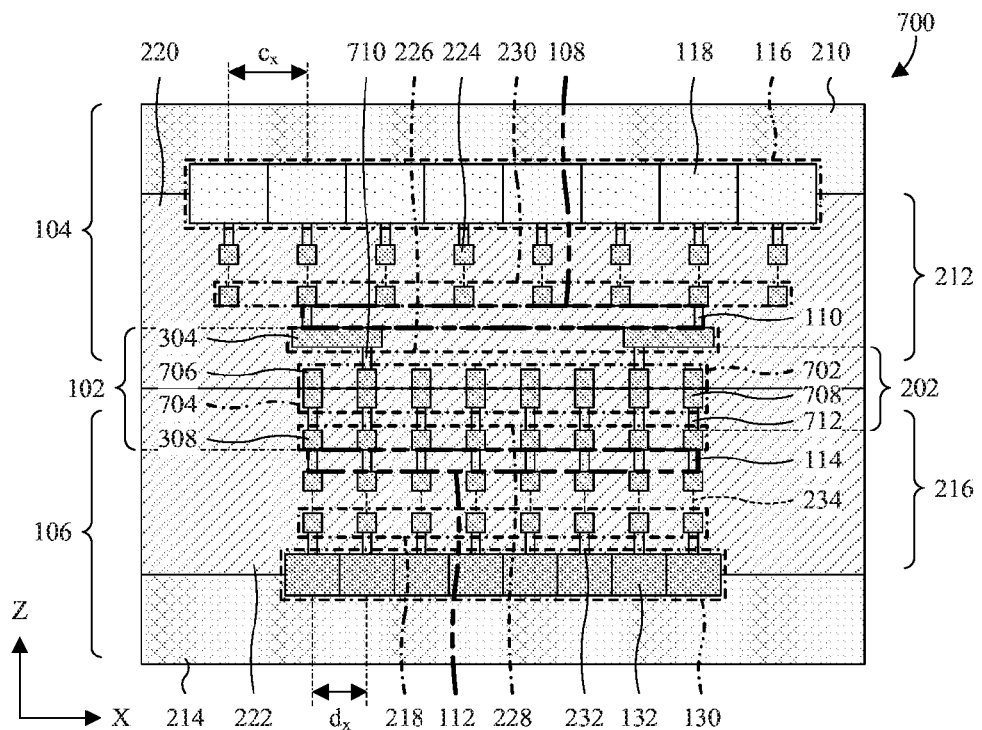
FIG. 7 illustrates a cross-sectional view of some embodiments of the stacked image sensor of FIG. 1A in which a pixel chip and a logic chip are hybrid bonded together.

With reference to FIG. 7, a cross-sectional view 700 of other embodiments of the stacked image sensor of FIG. 2 is provided in which a C2C interface layer 202 employs hybrid bonding. While the cross-sectional view 700 illustrates hybrid bonding with respect to the stacked image sensor of FIG. 2, it is to be appreciated that hybrid bonding may be employed with the stacked image sensors of FIGS. 4-6. As illustrated, the C2C interface layer 202 comprises a first bond layer 702 and a second bond layer 704. The first and second bond layers 702, 704 contact one another at an interface between a pixel chip 104 and a logic chip 106, and are respectively arranged in a first ILD region 220 and a second ILD region 222 that also contact one another at the interface. In some embodiments, the first and second bond layers 702, 704 share a common footprint, and/or are a metal, such as copper or aluminum copper, or some other conductive material. Advantageously, by employing hybrid bonding with the C2C interface layer 202, leakage current and parasitic capacitance may be minimized.

First electrodes 706 define the first bond layer 702 and second electrodes define the second bond layer 704. The first electrodes 706 contact corresponding ones of the second electrodes 708 at the interface between the pixel chip 104 and the logic chip 106 and, in some embodiments, there is a one to one correspondence between the first electrodes 706 and the second electrodes 708. The first electrodes 706 are further electrically coupled to corresponding ones of the first interconnect features 304 through corresponding first bond vias 710. In some embodiments, there is a one to one correspondence between the first electrodes 706 and the first interconnect features 304, and/or between the first electrodes 706 and the first bond vias 710. The second electrodes 708 are further electrically coupled to corresponding ones of the second interconnect features 308 through corresponding second bond vias 712. In some embodiments, there is a one to one correspondence between the second electrodes 706 and the second interconnect features 308, and/or between the second electrodes 706 and the second bond vias 712. The first and second bond vias 710, 712 may be, for example, a metal, such as copper or tungsten, or some other conductive material.

Figure 8:
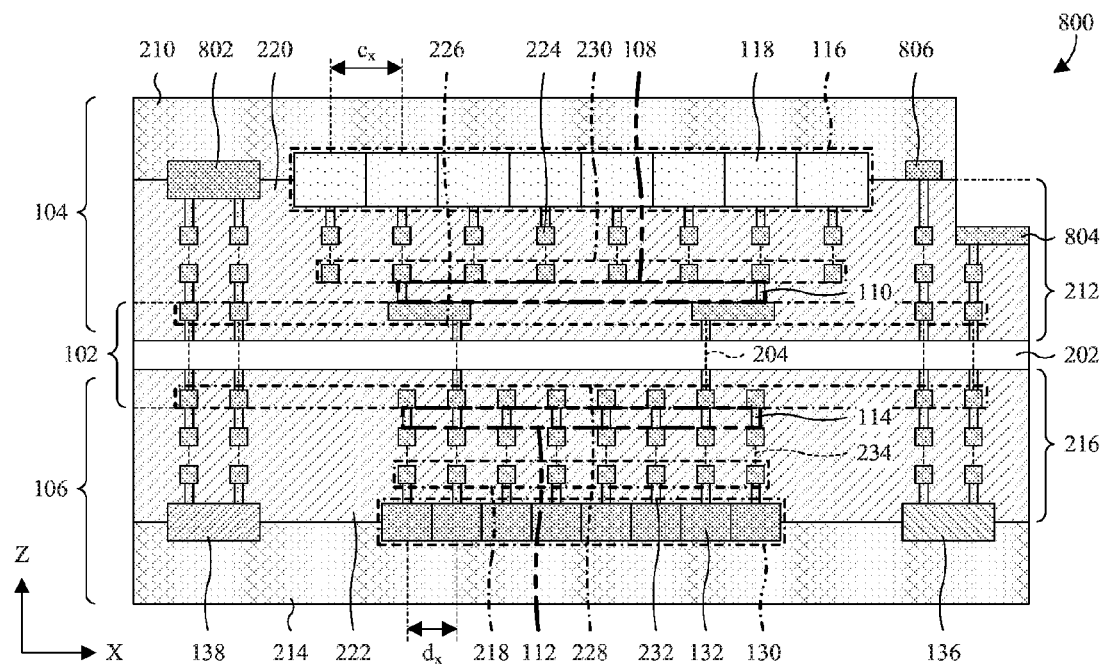
FIG. 8 illustrates a cross-sectional view of some embodiments of the stacked image sensor of FIG. 1A in which the rerouting layer connects components of a pixel chip other than a pixel sensor array to components of a logic chip other than a readout circuit array.

With reference to FIG. 8, a cross-sectional view 800 of other embodiments of the stacked image sensor of FIG. 2 is provided in which a rerouting layer 102 is additionally employed to electrically couple components of a pixel chip 104 and a logic chip 106 other than a pixel sensor array 116 and a readout circuit array 130. For example, the rerouting layer 102 may be employed to electrically couple second peripheral circuits 138 (e.g., a row decoder/driver) in the logic chip 106 to a block 802 of circuitry in the pixel chip 104. In some embodiments, the second peripheral circuits 138 are configured to drive reset, select, and/or transfer transistors of the pixel sensor array 116. As another example, the rerouting layer 102 may be employed to electrically couple first peripheral circuits 136 (e.g., an ISP) in the logic chip 106 to a bond pad 804 in the pixel chip 104 and/or to a power supply region 806 in the pixel chip 104. The bond pad 804 may be, for example, metal, such as copper, or some other conductive material. The power supply region 806 may correspond to, for example, a doped region of a first semiconductor substrate 210 that is used for supplying a positive supply voltage, a negative supply voltage, or a reference voltage to electronic devices of the pixel chip 104. Advantageously, by employing the rerouting layer 102 for components of the pixel and logic chips 104, 106 other than the pixel sensor array 116 and the readout circuit array 130, manufacturing steps may be minimized and/or costs may be reduced.

Figure 9:
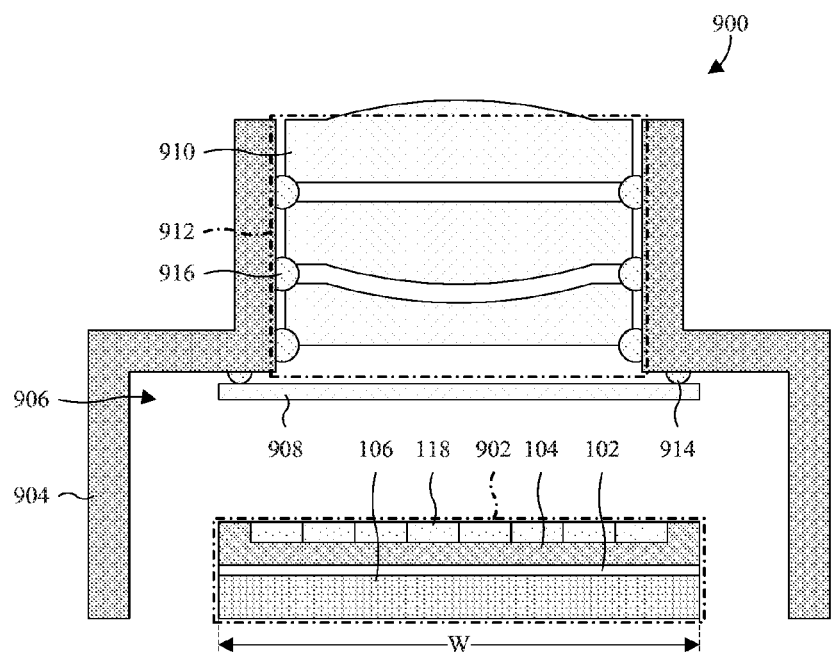
FIG. 9 illustrates a cross-sectional view of some embodiments of an image sensor package comprising a stacked image sensor with a rerouting layer stacked between a pixel chip and a logic chip having substantially the same size.

With reference to FIG. 9, a cross-sectional view 900 of some embodiments of an image sensor package is provided in which a stacked image sensor 902 comprises a rerouting layer 102 stacked between a pixel chip 104 and a logic chip 106 that have substantially same sizes. For example, the pixel chip 104 may have a footprint area that varies from that of the logic chip 106 by no more than about 10%, 5%, 3%, or 1% of the footprint area. Further, the pixel and logic chips 104, 106 have footprint centroids and/or edges that are substantially aligned vertically. For example, edges or footprint centroids of the pixel and logic chips 104, 106 may be laterally offset by no more than 10%, 5%, 3%, or 1% of a width W of the pixel and logic chips 104, 106. The stacked image sensor 902 may be, for example, configured according to FIG. 1A or 2, or one of FIGS. 4-8.

Advantageously, by configuring the pixel and logic chips 104, 106 with substantially the same size and vertically aligning the pixel and logic chips 104, 106, image quality of pixel sensors 118 on the pixel chip 104 is high. For example, where the pixel chip 104 is larger than the logic chip 106, peripheral pixel sensors unsupported by the logic chip 106 may be stressed, thereby inducing dark current that may degrade image quality. As another example, where the pixel chip 104 is smaller than the logic chip 106, radiation may reflect off the logic chip 106 and induce ghosting or flaring on peripheral pixel sensors that may degrade image quality.

In some embodiments, a housing 904 defines a cavity 906 that accommodates the stacked image sensor 902. Further, the housing 904 supports a transparent plate 908 and one or more lenses 910 over the stacked image sensor 902. The transparent plate 908 is arranged in the cavity 906 and extends laterally across an opening 912 of the housing 904 that leads into the cavity 906. In some embodiments, the transparent plate 908 is bonded or otherwise secured to the housing 904 by a first bonding structure 914. The transparent plate 908 may be, for example, glass, and/or the first bonding structure 914 may be, for example, an epoxy. The lens(es) 910 are stacked in the opening 912 and are configured to focus incident radiation on the pixel sensors 118 of the stacked image sensor 902. In some embodiments the lens(es) 910 are bonded or otherwise secured to the housing 904 by second bonding structures 916. The second bonding structures 916 may be, for example, an epoxy.

Figure 10:
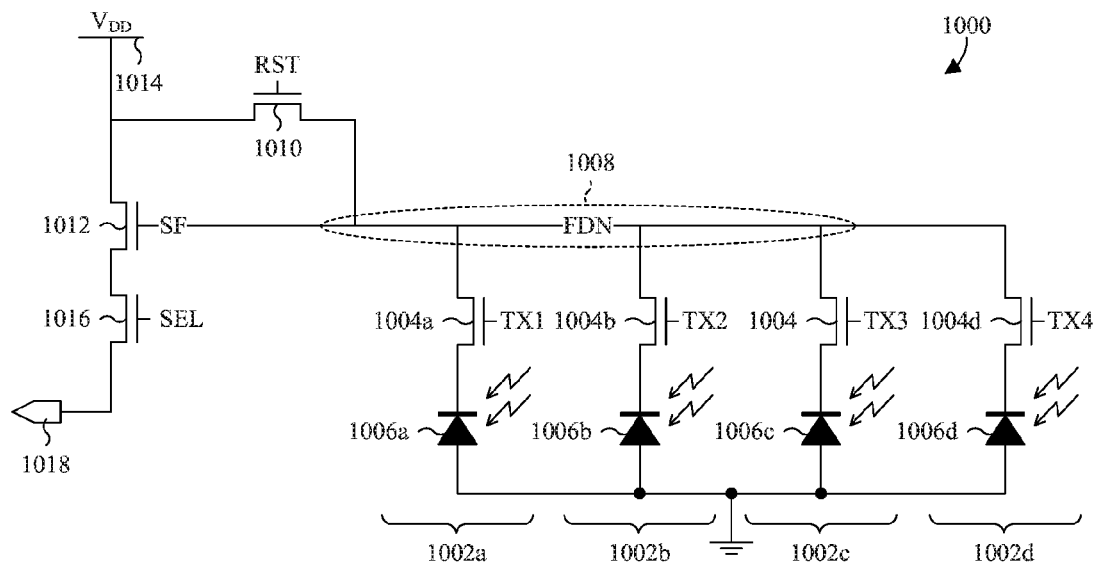
FIG. 10 illustrates a circuit diagram of some embodiments of a block of adjoining pixel sensors.

With reference to FIG. 10, a circuit diagram 1000 of some embodiments of a block of adjoining pixel sensors 1002a-1002d is provided. The block of FIG. 10 may be employed within the stacked image sensors of FIGS. 1A, 2, 3A-3C, and 4-9 and, in some embodiments, each block within the stacked image sensors of FIGS. 1A, 2, 3A-3C is configured according to the block of FIG. 10. For example, the block 126 of FIG. 1A may be configured according to the block of FIG. 10. Further, the adjoining pixel sensors 1002-1002d may be arranged within a single row, a single column, or across multiple rows and columns of a pixel sensor array.

As illustrated, the pixel sensors 1002a-1002d comprises individual transfer transistors 1004a-1004d and individual photodetectors 1006a-1006d. The transfer transistors 1004a-1004d are configured to selectively transfer charge accumulated in respective ones of the photodetectors 1006a-1006d to a floating diffusion node (FDN) 1008 shared by the pixel sensors 1002a-1002d. The transfer transistors 1004a-1004d carry out the transfer by electrically coupling the respective ones of the photodetectors 1006a-1006d to the FDN 1008. The transfer transistors 1004a-1004d may be, for example, a metal-oxide-semiconductor field-effect transistor (MOSFET). The photodetectors 1006a-1006d and the FDN 1008 may be, for example, n-type or p-type doped regions that are embedded in a semiconductor substrate and surrounded by regions of the semiconductor substrate having opposite doping types.

A reset transistor 1010 is configured to selectively clear charge in the FDN 1008, and a source follower transistor 1012 is configured to non-destructively read and amplify charge stored in the FDN 1008. The reset transistor 1010 clears charge in the FDN 1008 by electrically coupling the FDN 1008 to a power source 1014, and the source follower transistor 1012 non-destructively reads and amplifies charge stored in the FDN 1008 by gating based on the FDN 1008. Such gating may be performed by, for example, electrically coupling a gate of the source follower transistor 1012 to the FDN 1008. The source follower transistor 1012 is electrically coupled in series between the power source 1014 and a select transistor 1016, and the select transistor 1016 is configured to selectively couple the source follower transistor 1012 to an output 1018. The output 1018 may, for example, be electrically coupled to a first via 110 in FIG. 1A, and/or the power source 1014 may be, for example, a direct current (DC) power source. Further, the reset transistor 1010, the source follower transistor 1012, and the select transistor 1016 may be, for example, MOSFETs.

In operation, the pixel sensors 1002a-1002d are selected for readout by the select transistor 1016, and are sequentially read using the reset transistor 1010 and the transfer transistors 1004a-1004d. In some embodiments, the process for reading a pixel sensor 1002a-1002d comprises clearing charge in the FDN 1008 with the reset transistor 1010, and transferring charge of the pixel sensor 1002a-1002d to the FDN 1108 with a respective one of the transfer transistors 1004a-1004d.

While not illustrated, at least some shared components of the pixel sensors 1002a-1002d are arranged directly on the pixel sensors 1002a-1002d. Further, in some embodiments, some shared components of the pixel sensors 1002a-1002d are arranged at an edge of a pixel sensor array within which the pixel sensors 1002a-1002d are arranged. Shared components of the pixel sensors 1002a-1002d comprise the FDN 1008, the reset transistor 1010, the source follower transistor 1012, and the select transistor 1016.

With reference to FIGS. 11-21, a series of cross-sectional views 1100-2100 of some embodiments of a method for manufacturing a stacked image sensor with a rerouting layer is provided. While the cross-sectional views 1100-2100 are directed towards embodiments of the stacked image sensor described in FIG. 7, the method is applicable to other embodiments of the stacked image sensor, such as the embodiments described in FIGS. 1A, 2, 3A-3C, 4-6, 8, and 9.

Figure 11:
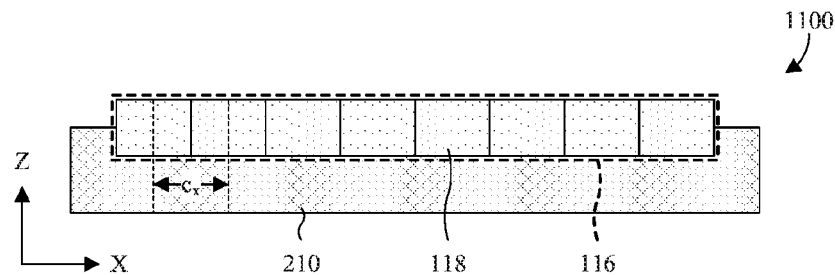
FIGS. 11-21 illustrate a series of cross-sectional views of some embodiments of a method for manufacturing a stacked image sensor with a rerouting layer.

As illustrated by the cross-sectional view 1100 of FIG. 11, a pixel sensor array 116 of pixel sensors 118 is formed on a first semiconductor substrate 210. In some embodiments, the pixel sensors 118 are formed uniformly spaced in an x direction according to an x-direction pitch $c_x$, and/or are formed as APSs or photodetectors, such as photodiodes. For example, forming the pixel sensors 118 may comprise, for each of the pixel sensors 118, forming a doped region in the first semiconductor substrate 210 that has an opposite doping type (e.g., p-type or n-type) as a surrounding region of the first semiconductor substrate 210 to define a PN or PIN junction. The doped region may be formed by, for example, ion implantation. Further in some embodiments, the pixel sensors 118 are formed according to complementary metal-oxide-semiconductor (CMOS) manufacturing processes.

Figure 12:
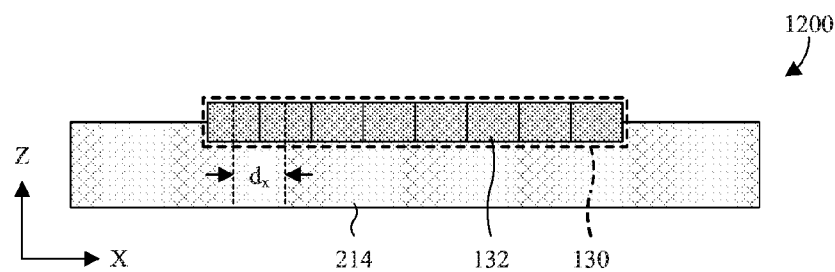

As illustrated by the cross-sectional view 1200 of FIG. 12, a readout circuit array 130 of readout circuits 132 is formed on a second semiconductor substrate 214. In some embodiments, the readout circuits 132 are formed uniformly spaced in then x direction according to an x-direction pitch $d_x$. The x-direction pitch $d_x$ of the readout circuits 132 may be, for example, less than that of the pixel sensors 118 in FIG. 11. Further, in some embodiments, the readout circuits 132 are formed as ADCs and/or according to CMOS manufacturing processes.

Figure 13:
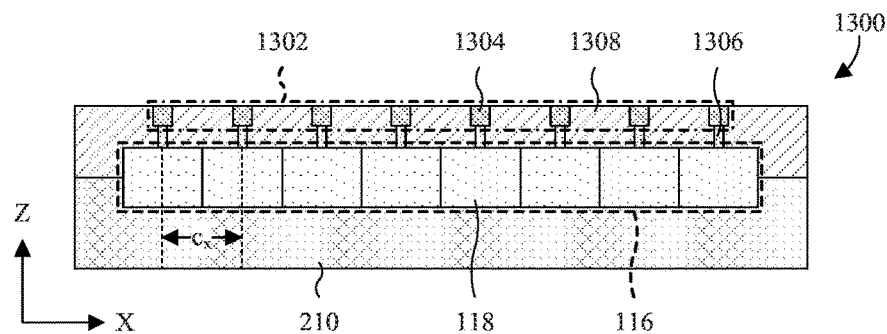

As illustrated by the cross-sectional view 1300 of FIG. 13, a fourth interconnect layer 1302 is formed over the pixel sensor array 116. The fourth interconnect layer 1302 is formed with fourth interconnect features 1304 electrically coupled to corresponding ones of the pixel sensors 118 by corresponding fourth vias 1306. Further, the fourth interconnect layer 1302 is formed recessed in an upper or top surface of a fourth ILD layer 1308 covering the pixel sensor array 116 and, in some embodiments, is formed with an upper or top surface that is substantially coplanar with the upper or top surface of the fourth ILD layer 1308. The fourth interconnect layer 1302, the fourth vias 1306, and the fourth ILD layer 1308 may be formed by, for example, a single-damascene-like process or a dual-damascene-like CMOS process. A single-damascene-like process and a dual-damascene-like process are respectively a single-damascene process and a dual-damascene process that are not restricted to copper. Further, the fourth interconnect layer 1302 and/or the fourth vias 1306 may be formed of, for example, a conductive material, such as copper, tungsten, or some other metal, and/or the fourth ILD layer 1308 may be formed of, for example, silicon dioxide, a low κ dielectric, or some other dielectric.

According to some embodiments of a single-damascene-like process: a first sublayer of the fourth ILD layer 1308 is deposited or otherwise grown covering the pixel sensor array 116; a first planarization is performed into an upper or top surface of the first sublayer; a first etch is performed into the first sublayer to form via openings; a first conductive layer is deposited or otherwise grown filling the via openings; a second planarization is performed into the first conductive layer to coplanarize an upper or top surface of the first conductive layer with that of the first sublayer and to form the fourth vias 1306; a second sublayer of the fourth ILD layer 1308 is deposited or otherwise grown covering the first sublayer and the fourth vias 1306; a third planarization is performed into an upper or top surface of the second sublayer; a second etch is performed into the second sublayer to form feature openings exposing the fourth vias 1306; a second conductive layer is deposited or otherwise grown filling the feature openings; and a fourth planarization is performed into the second conductive layer to coplanarize an upper or top surface of the second conductive layer with that of the second sublayer and to form the fourth interconnect features 1304.

According to some embodiments of a dual-damascene-like process: the ILD layer 1308 is deposited or otherwise grown covering the pixel sensor array 116; a first planarization is performed into an upper or top surface of the fourth ILD layer 1308; a first etch is performed into the fourth ILD layer 1308 to form feature openings; a second etch is performed into the fourth ILD layer 1308, through the feature openings, to form via openings; a conductive layer is deposited or otherwise grown filling the feature and via openings; a second planarization is performed into the conductive layer to coplanarize an upper or top surface of the conductive layer with that of the fourth ILD layer 1308 and to form the fourth interconnect features 1304 and the fourth vias 1306.

Figure 14:
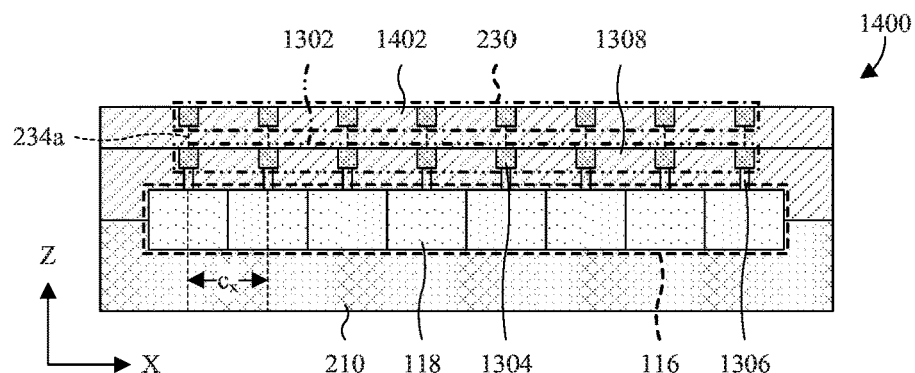

As illustrated by the cross-sectional view 1400 of FIG. 14, the acts of FIG. 13 are repeated one or more times to form a third interconnect layer 230 overlying the fourth interconnect layer 1302. The third interconnect layer 230 is formed embedded in an upper or top surface of a third ILD layer 1402 and electrically coupled to the fourth interconnect layer 1302 along conductive paths 234a. In some embodiments, the conductive paths 234a are additional vias. In other embodiments, the conductive paths 234a are defined by an alternating stack of additional via layers and additional interconnect layers.

Figure 15:
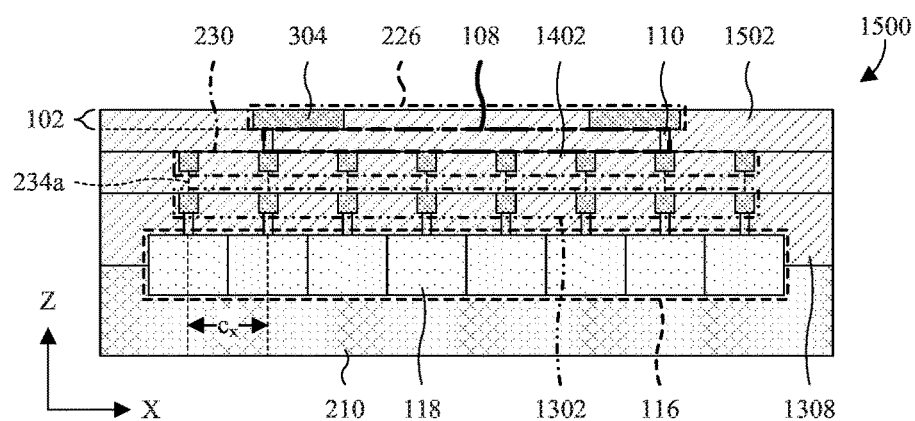

As illustrated by the cross-sectional view 1500 of FIG. 15, a first interconnect layer 226 partially defining a rerouting layer 102 is formed overlying the third interconnect layer 230. The first interconnect layer 226 is formed with first interconnect features 304 arranged over and electrically coupled to the third interconnect layer 230 through corresponding first vias 110 of a first via array 108. Further, the first interconnect layer 226 is formed embedded in an upper or top surface of a first ILD layer 1502 and, in some embodiments, with an upper or top surface that is substantially coplanar with an upper or top surface of the first ILD layer 1502.

In some embodiments, the process for forming the first interconnect layer 226 comprises forming the first vias 110 laterally arranged in rows and columns respectively according to an x-direction pitch and a y-direction pitch. In some embodiments, the x-direction pitch corresponds to intra-row spacing between neighboring vias, and/or the y-direction pitch corresponds to intra-column spacing between neighboring vias. Further, in some embodiments, the process for forming the first interconnect layer 226 comprises routing first interconnect features 304 to laterally translate the x-direction or y-direction pitch to a different pitch, such as, for example, a smaller pitch. Even more, in some embodiments, the process for forming the first interconnect layer 226 is performed according a single-damascene-process or a dual-damascene-like process. The single-damascene-process or the dual-damascene-like process may be, for example, as described with regard to FIG. 13.

Figure 16:
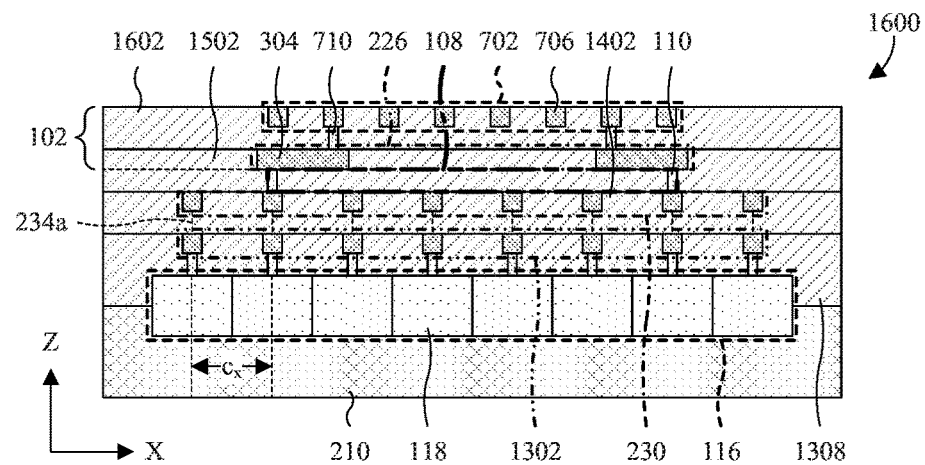

As illustrated by the cross-sectional view 1600 of FIG. 16, a first bond layer 702 is formed over the first interconnect layer 226, embedded in an upper or top surface of a first bond ILD layer 1602. The first bond layer 702 is formed with first electrodes 706 arranged over and electrically coupled to corresponding ones of the first interconnect features 304 through corresponding first bond vias 710. Further, in some embodiments, the first bond layer 702, the first bond vias 710, and the first bond ILD layer 1602 are formed by of a single-damascene-like process or a dual-damascene-like CMOS process, and/or the first bond ILD layer 1602 is formed of silicon dioxide, a low κ dielectric, PSG, or some other dielectric As illustrated by the cross-sectional view 1700 of FIG. 17, a fifth interconnect layer 1702 is formed over the readout circuit array 130. The fifth interconnect layer 1702 is formed with fifth interconnect features 1704 electrically coupled to corresponding ones of the readout circuits 132 by corresponding fifth vias 1706. Further, the fifth interconnect layer 1702 is formed recessed in an upper or top surface of a fifth ILD layer 1708 covering the readout circuit array 130 and, in some embodiments, is formed with an upper or top surface that is substantially coplanar with an upper or top surface of the fifth ILD layer 1708. The fifth interconnect layer 1702, the fifth vias 1706, and the fifth ILD layer 1708 may be formed by, for example, a single-damascene-like process or a dual-damascene-like CMOS process. Further, the fifth interconnect layer 1702 and/or the vias 1706 may be formed of, for example, a conductive material, such as copper, tungsten, or some other metal, and/or the fifth ILD layer 1708 may be formed of, for example, silicon dioxide, a low κ dielectric, PSG, or some other dielectric.

Figure 17:
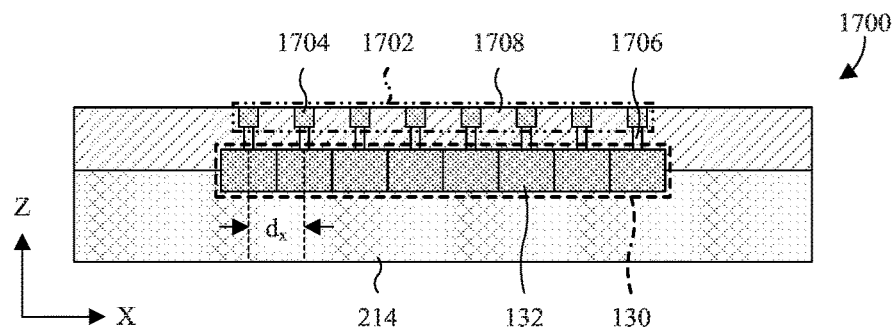
Figure 18:
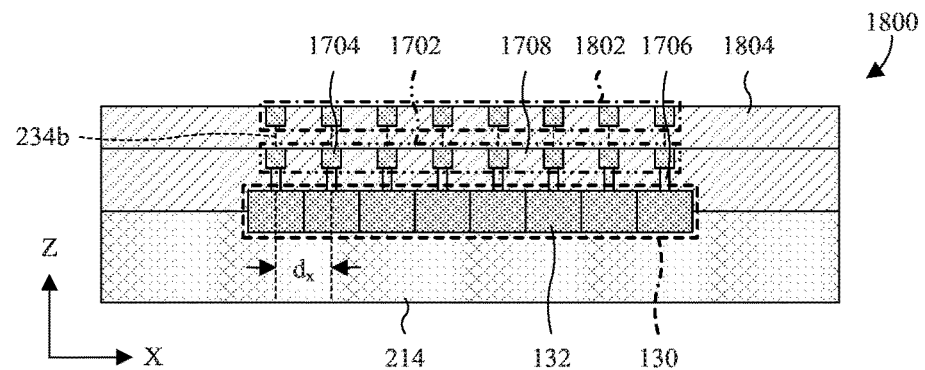

As illustrated by the cross-sectional view 1800 of FIG. 18, the acts of FIG. 17 are repeated one or more times to form an sixth interconnect layer 1802 overlying the fifth interconnect layer 1702. The sixth interconnect layer 1802 is formed embedded in an upper or top surface of a sixth ILD layer 1804 and electrically coupled to the fifth interconnect layer 1702 along conductive paths 234*b*. In some embodiments, the conductive paths 234*b* are additional vias. In other embodiments, the conductive paths 234*b* are defined by an alternating stack of additional via layers and additional interconnect layers.

Figure 19:
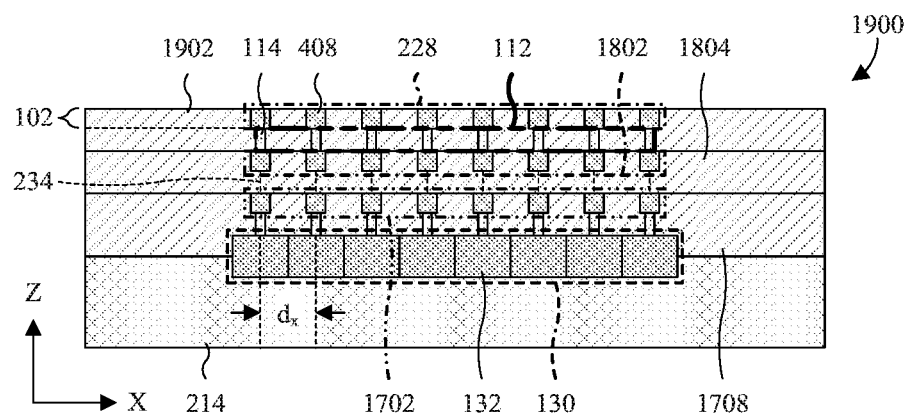

As illustrated by the cross-sectional view 1900 of FIG. 19, a second interconnect layer 228 of the rerouting layer 102 is formed overlying the sixth interconnect layer 1802. The second interconnect layer 228 is formed with second interconnect features 408 arranged over and electrically coupled to the sixth interconnect layer 1802 through corresponding second vias 114 of a second via array 112. Further, the second interconnect layer 228 is formed embedded in an upper or top surface of a second ILD layer 1902 and, in some embodiments, with an upper or top surface that is substantially coplanar with an upper or top surface of the second ILD layer 1902.

In some embodiments, the process for forming the second interconnect layer 228 comprises forming the second vias 114 laterally arranged in rows and columns respectively according to an x-direction pitch and a y-direction pitch. In some embodiments, the x-direction pitch of the second vias 114 is formed less than that of the first vias 110 in FIG. 15, and/or the y-direction pitch of the second vias 114 is formed less than that of first vias 110 in FIG. 15. Further, in some embodiments, the process for forming the second interconnect layer 228 comprises routing the second interconnect features 408 to laterally translate the x-direction or y-direction pitch to a different pitch, such as, for example, a larger pitch. Moreover, in some embodiments, the process for forming the second interconnect layer 228 is performed according a single-damascene-process or a dual-damascene-like process. The single-damascene-process or the dual-damascene-like process may be, for example, as described with regard to FIG. 13.

Figure 20:
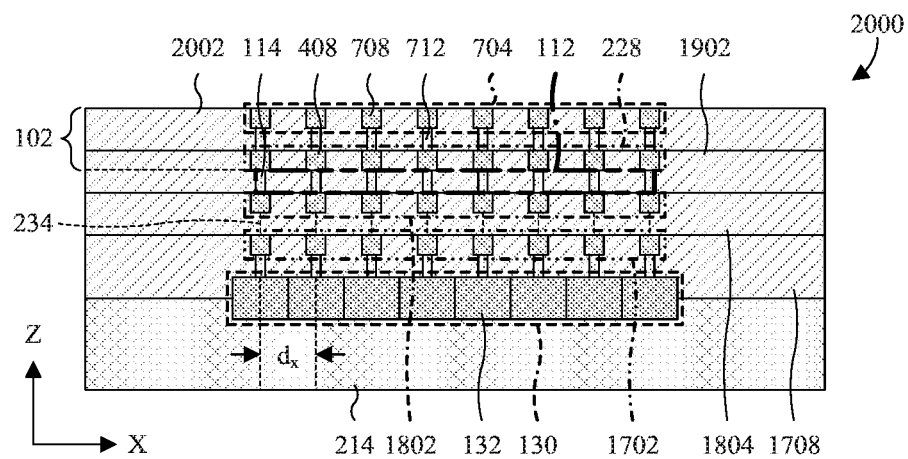

As illustrated by the cross-sectional view 2000 of FIG. 20, a second bond layer 704 is formed over the second interconnect layer 228, embedded in an upper or top surface of a second bond ILD layer 2002. The second bond layer 704 is formed with second electrodes 708 arranged over and electrically coupled to corresponding ones of the second interconnect features 308 through corresponding second bond vias 712. In some embodiments, the second bond layer 704, the second bond vias 712, and the second bond ILD layer 2002 are formed by a single-damascene-like process or a dual-damascene-like CMOS process. Further, in some embodiments, the second bond ILD layer 2002 is formed of silicon dioxide, a low κ dielectric, PSG, or some other dielectric.

Figure 21:
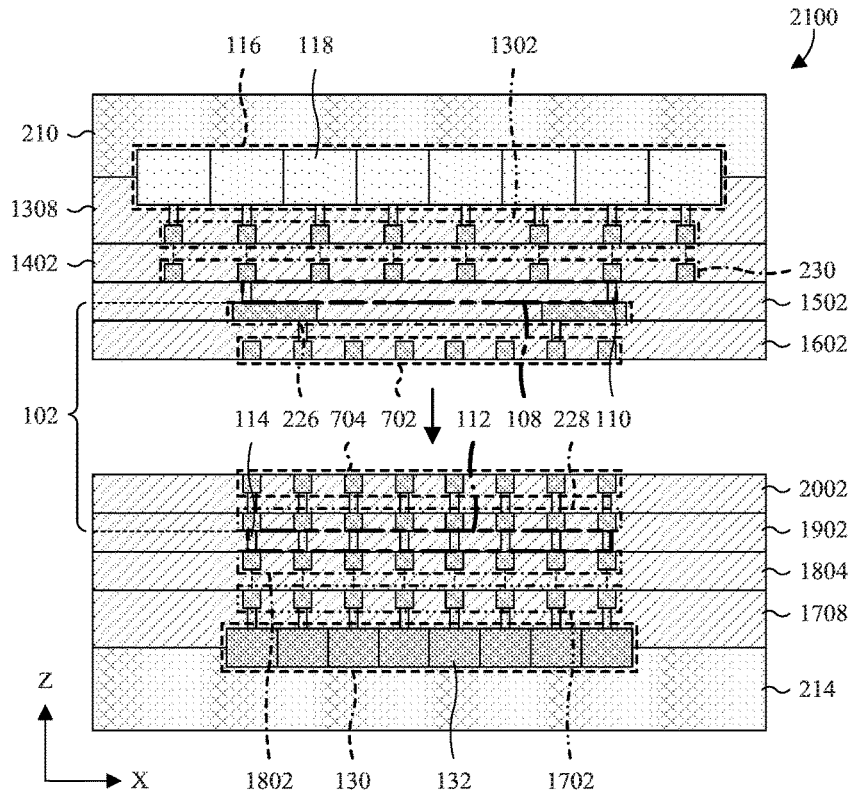

As illustrated by the cross-sectional view 2100 of FIG. 21, the semiconductor structures of FIGS. 16 and 20 are bonded and electrically coupled together through the first and second bond layers 702, 704 by a hybrid bonding process. In some embodiments, the hybrid bonding process comprises a fusion bonding process between the first and second bond ILD layers 1602, 2002, and a bonding process between the first and second bond layers 702, 704.

By bonding and electrically coupling the semiconductor structures of FIGS. 16 and 20 together, the first via array 108 is electrically coupled to the second via array 112 through the first and second interconnect layers 226, 228, thereby electrically coupling the pixel sensor array 116 to the readout circuit array 130. Further, by bonding and electrically coupling the semiconductor structures of FIGS. 16 and 20 together, the first and second interconnect layers 226, 228 collectively translate between differences in the x-direction pitches of the first and second via arrays 108, 112 and differences in y-direction pitches of the first and second via arrays 108, 112. As described above, this may advantageously allow a high readout rate of the pixel sensor array 116 and a high functionality per footprint area of the readout circuit array 130.

Figure 22:
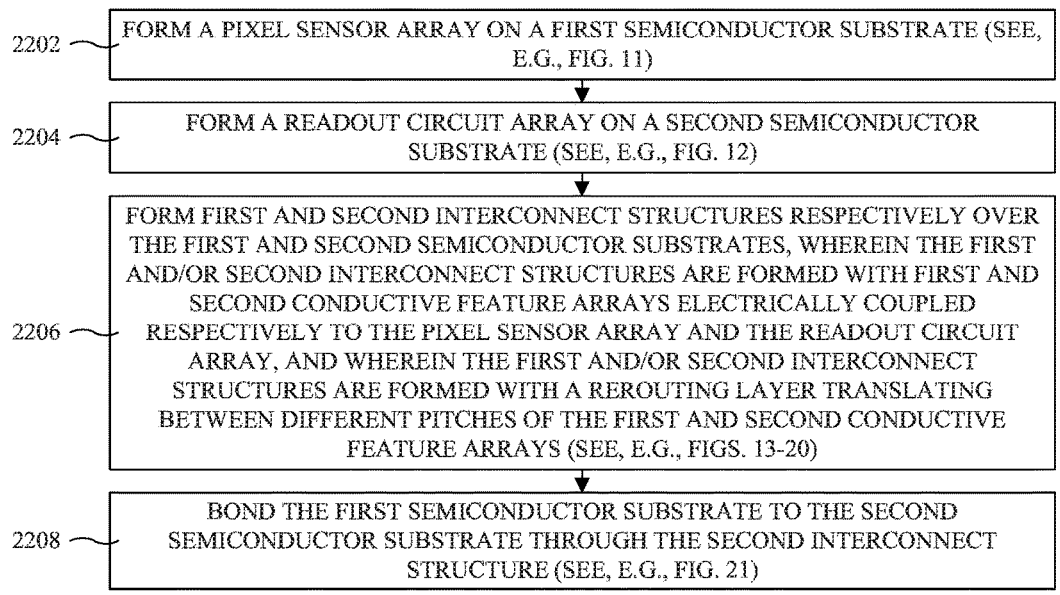
FIG. 22 illustrates a flowchart of some embodiments of a method for manufacturing a stacked image sensor with a rerouting layer.

With reference to FIG. 22, a flowchart 2200 of some embodiments of a method for manufacturing a stacked image sensor with a rerouting layer.

At 2202, an array of pixel sensors is formed on a first semiconductor substrate. See, for example, FIG. 11.

At 2204, a readout circuit array is formed on a second semiconductor substrate. See, for example, FIG. 12.

At 2206, first and second interconnect structures are respectively formed over the first and second semiconductor substrates. The first and second interconnect structures are formed with respective first and second conductive feature arrays electrically coupled respectively to the pixel sensor array and the readout circuit array. The first and/or second interconnect structures is/are further formed with a rerouting layer translating between different pitches of the first and second conductive feature arrays. Conductive features of the first and second conductive feature arrays may be, for example, vias, conductive pads, electrodes, or other conductive features to which the rerouting layer can electrically couple. See, for example, FIGS. 13-20.

At 2208, the first semiconductor substrate is bonded to the second semiconductor substrate through the second interconnect structure. See, for example, FIG. 21.

In some embodiments of the method, the method is employed to form the stacked image sensors of FIGS. 1A, 2, 3A-3C, and 4-9. For example, the pixel and logic chips may be formed with a common size. As another example, the rerouting layer may be formed localized to the first interconnect structure or the second interconnect structure. As another example, the pixel and logic chips may be bonded together by hybrid bonding. Hybrid bonding may comprise contacting a first ILD region of the first interconnect structure to a second ILD region of the second interconnect structure at a boundary between the logic and pixel chips, and further contacting a first bond layer recessed into the first ILD region to a second bond layer recessed into the second ILD region at the boundary. As yet another example, the rerouting layer may be formed electrically coupling a first component of the pixel chip to a second component of the logic chip through the rerouting layer, where the first and second components are laterally offset from the pixel sensor and readout circuit arrays.

While the method described by the flowchart 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a stacked image sensor. A pixel chip is arranged over a logic chip. The pixel chip and the logic chip respectively comprise a pixel sensor array and a readout circuit array. A first conductive feature array is arranged under and electrically coupled to the pixel sensor array. The first conductive feature array has a first pitch. A second conductive feature array is arranged over and electrically coupled to the readout circuit array. The second conductive feature array has a second pitch different than the first pitch. A rerouting layer is arranged between the first and second conductive feature arrays. The rerouting layer electrically couples the first conductive feature array to the second conductive feature array while translating between the first and second pitches.

In other embodiments, the present disclosure provides a method for manufacturing a stacked image sensor. A pixel sensor array is formed on a first semiconductor substrate. A readout circuit array is formed on a second semiconductor substrate. A first interconnect structure and a second interconnect structure are respectively formed on the first and second semiconductor substrates. Forming the first and second interconnect structures comprises forming a first conductive feature array and a second conductive feature array electrically coupled respectively to the pixel sensor and readout circuit arrays. Forming the first and second interconnect structures further comprises forming a rerouting layer electrically coupling the first conductive feature array to the second conductive feature array while translating between different pitches of the first and second conductive feature arrays. The first semiconductor substrate is bonded to the second semiconductor substrate through the second interconnect structure.

In yet other embodiments, the present disclosure provides another stacked image sensor. A pixel chip is arranged over a logic chip. The pixel chip and the logic chip respectively comprise a pixel sensor array and a readout circuit array. The pixel sensor array is divided into blocks of adjoining pixel sensors that correspond to readout circuits of the readout circuit array. A first conductive feature array is arranged under and electrically coupled to the pixel sensor array. The first conductive feature array has a first pitch. The first conductive feature array comprises first conductive features arranged under and electrically coupled to corresponding ones of the blocks. A second conductive feature array is arranged over and electrically coupled to the readout circuit array. The second conductive feature array has a second pitch smaller than the first pitch. The second conductive feature array comprises second conductive features arranged over and electrically coupled to corresponding ones of the readout circuits. A rerouting layer is arranged between the first and second conductive feature arrays. The rerouting layer electrically couples the first conductive features to corresponding ones of the second conductive features to electrically couple the blocks to the readout circuits while translating between the first and second pitches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked image sensor comprising:
  a pixel chip arranged over a logic chip, wherein the pixel chip and the logic chip respectively comprise a pixel sensor array and a readout circuit array, and wherein the readout circuit array comprises a trio of readout circuits;
  a first conductive feature array arranged under and electrically coupled to the pixel sensor array, wherein the first conductive feature array comprises a trio of first conductive features, wherein the first conductive features are laterally and substantially uniformly spaced in a first line by a first pitch;

a second conductive feature array arranged over and electrically coupled to the readout circuit array, wherein the second conductive feature array comprises a trio of second conductive features, wherein the second conductive features are laterally and substantially uniformly spaced in a second line by a second pitch different than the first pitch, wherein the readout circuits are laterally and substantially uniformly spaced in a third line by the second pitch, and wherein the first, second, and third lines are substantially parallel; and a rerouting layer arranged between the first and second conductive feature arrays, wherein the rerouting layer electrically couples each of the first conductive features to an individual conductive feature of the second conductive features while translating between the first and second pitches.

2. The stacked image sensor according to claim 1, wherein the first and second conductive feature arrays are respectively first and second via arrays, wherein first vias of the first via array are electrically coupled to corresponding pixel sensors of the pixel sensor array, and wherein second vias of the second via array are electrically coupled to corresponding readout circuits of the readout circuit array.

3. The stacked image sensor according to claim 1, wherein the rerouting layer comprises:

a first interconnect layer and a second interconnect layer respectively arranged in a first interconnect structure of the pixel chip and a second interconnect structure of the logic chip.

4. The stacked image sensor according to claim 3, wherein the first and second pitches extend laterally in an x direction, wherein the first interconnect layer comprises a plurality of first line-shaped interconnect features laterally elongated in the x direction, wherein the first line-shaped interconnect features are each longer in the x direction than a y direction extending laterally orthogonal to the x direction, wherein the first line-shaped interconnect features translate between the first and second pitches, wherein the first line-shaped interconnect features are elongated substantially in parallel, and wherein each of the first conductive features is electrically coupled to an individual one of the first line-shaped interconnect features.

5. The stacked image sensor according to claim 4, wherein the first conductive feature array and the second conductive feature array respectively comprise third and fourth pitches extending laterally in the y direction, wherein the second interconnect layer comprises a plurality of second line-shaped interconnect features laterally elongated in the y direction, wherein the second line-shaped interconnect features are each longer in the y direction than the x direction, wherein the second line-shaped interconnect features translate between the third and fourth pitches, wherein the second line-shaped interconnect features are elongated substantially in parallel, and wherein each of the first conductive features is electrically coupled to an individual one of the second line-shaped interconnect features.

6. The stacked image sensor according to claim 1, wherein the pixel chip and the logic chip have substantially the same size.

7. The stacked image sensor according to claim 1, wherein the readout circuit array comprises analog to digital converters (ADCs) arranged in rows and columns, and wherein the pixel sensor array comprises active pixel sensors (APSs) arranged in rows and columns.

8. The stacked image sensor according to claim 1, wherein the first conductive features are each electrically coupled to a plurality of adjoining pixel sensors of the pixel sensor array, wherein the second conductive features are each electrically coupled to an individual readout circuit of the readout circuit array, wherein each of the first conductive features are electrically coupled to the individual conductive feature of the second conductive features by an individual conductive path defined by the rerouting layer, and wherein the individual conductive path extends laterally in multiple orthogonal directions.

9. The stacked image sensor according to claim 8, wherein the second conductive features are at a first elevation above the readout circuit array, wherein the first conductive features are at a second elevation above the readout circuit array, and wherein the first and second elevations are different.

10. The stacked image sensor according to claim 1, wherein each of the readout circuits directly underlies an individual one of the second conductive features.

11. The stacked image sensor according to claim 10, wherein the pixel sensor array comprises a trio of pixel blocks, wherein each of the pixel blocks comprises a plurality of continuously adjoining pixel sensors, wherein the pixel blocks are laterally and substantially uniformly spaced in a fourth line by the first pitch and each directly overlies an individual one of the first conductive features, and wherein the fourth line is substantially parallel to the first line.

12. A stacked image sensor comprising:

a pixel chip arranged over a logic chip, wherein the pixel chip comprises a pixel sensor array, wherein the logic chip comprises a readout circuit array, wherein the readout circuit array comprises a plurality of readout circuits, wherein the pixel sensor array is divided into a plurality of blocks that correspond to the readout circuits of the readout circuit array, wherein each block in the plurality of blocks comprises of a plurality of adjoining pixel sensors, wherein the plurality of blocks comprise a first block and a second block, wherein the first block directly overlies and is electrically coupled to a first readout circuit of the readout circuit array, and wherein the second block is electrically coupled to a second readout circuit of the readout circuit array and is laterally spaced from the second readout circuit;

a first conductive feature array arranged under and electrically coupled to the pixel sensor array, wherein the first conductive feature array has a first pitch, wherein the first conductive feature array comprises a plurality of first conductive features in rows and columns, wherein each of the first conductive features underlies an individual block of the blocks and is electrically coupled to multiple adjoining pixel sensors defining the individual block;

a second conductive feature array arranged over and electrically coupled to the readout circuit array, wherein the second conductive feature array has a second pitch smaller than the first pitch, and wherein the second conductive feature array comprises second conductive features arranged over and electrically coupled to corresponding ones of the readout circuits; and a rerouting layer arranged between the first and second conductive feature arrays, wherein the rerouting layer electrically couples the first conductive features to corresponding ones of the second conductive features to electrically couple the blocks to the readout circuits while translating between the first and second pitches.

13. The stacked image sensor according to claim 12, wherein the blocks correspond to the readout circuits with a one-to-one correspondence.

14. The stacked image sensor according to claim 12, wherein each of the blocks is continuous and consists of four pixel sensors of the pixel sensor array, and wherein each of the blocks is non-overlapping with each other block of the pixel sensor array and overlaps a corresponding one of the readout circuits.

15. The stacked image sensor according to claim 12, wherein the first conductive features are vertically-elongated vias, and wherein the first conductive features correspond to the blocks with a one-to-one correspondence.

16. The stacked image sensor according to claim 15, wherein the second conductive features are vertically-elongated vias, wherein the second conductive features correspond to the readout circuits with a one-to-one correspondence, and wherein the second conductive features correspond to the first conductive features with a one-to-one correspondence.

17. The stacked image sensor according to claim 12, wherein the rerouting layer comprises:
a first interconnect layer and a second interconnect layer respectively arranged in a first interconnect structure of the pixel chip and a second interconnect structure of the logic chip, wherein the first and second pitches extend laterally in an x direction, and wherein the first interconnect layer comprises line-shaped interconnect features extending laterally in the x direction to translate between the first and second pitches.

18. The stacked image sensor according to claim 17, wherein the first conductive feature array and the second conductive feature array respectively comprise third and fourth pitches extending laterally in a y direction, wherein the y direction is orthogonal to the x direction, and wherein the second interconnect layer comprises line-shaped interconnect features extending laterally in the y direction to translate between the third and fourth pitches.

19. A stacked image sensor comprising:
a logic chip comprising a readout circuit array, wherein the readout circuit array comprises a plurality of readout circuits;
a pixel chip over the logic chip and comprising a pixel block array, wherein the pixel block array comprises a plurality of pixel blocks, wherein the pixel blocks correspond to the readout circuits with a one-to-one correspondence, such that each of the pixel blocks corresponds to a single one of the readout circuits, and wherein each of the pixel blocks comprises a plurality of continuously adjoining pixel sensors;
a first via array under the pixel block array and comprising a plurality of first vias, wherein the first vias correspond to the pixel blocks with a one-to-one correspondence and are electrically coupled respectively to the pixel blocks, wherein the first vias are in a plurality of pixel rows laterally spaced by a first pitch, and wherein the first vias are in a plurality of pixel columns laterally spaced by a second pitch;
a second via array over the readout circuit array, between the readout circuit array and the first via array, and comprising a plurality of second vias, wherein the second vias correspond to the readout circuits with a one-to-one correspondence and are electrically coupled respectively to the readout circuits, wherein the second vias are in a plurality of readout rows laterally spaced by a third pitch, and wherein the second vias are in a plurality of readout columns laterally spaced by a fourth pitch; and
a rerouting layer between the first and second via arrays, wherein the rerouting layer electrically couples the first vias respectively to the second vias while translating from the first pitch to the third pitch, and from the second pitch to the fourth pitch.

20. The stacked image sensor according to claim 12, wherein the second conductive features are in rows and columns, wherein each of the second conductive features overlies and is electrically coupled to an individual readout circuit of the readout circuit array, and wherein the first conductive features are each electrically coupled to an individual conductive feature of the second conductive feature array.

* * * * *